(12) United States Patent
Barnes et al.

(10) Patent No.: US 11,303,369 B2
(45) Date of Patent: Apr. 12, 2022

(54) BOOSTER GAIN ADJUSTMENT BASED ON USER EQUIPMENT (UE) NEED

(71) Applicant: WILSON ELECTRONICS, LLC, St. George, UT (US)

(72) Inventors: Joshua Kent Barnes, Roy, UT (US); Christopher Ken Ashworth, Toquerville, UT (US)

(73) Assignee: Wilson Electronics, LLC, St. George, UT (US)

( * ) Notice: Subject to any disclaimer, the term of this patent is extended or adjusted under 35 U.S.C. 154(b) by 0 days.

(21) Appl. No.: 16/597,759

(22) Filed: Oct. 9, 2019

(65) Prior Publication Data

US 2020/0112381 A1 Apr. 9, 2020

Related U.S. Application Data

(60) Provisional application No. 62/743,466, filed on Oct. 9, 2018.

(51) Int. Cl.
*H04W 52/24* (2009.01)
*H04W 52/52* (2009.01)
(Continued)

(52) U.S. Cl.
CPC ........... *H04B 17/40* (2015.01); *H03G 3/3042* (2013.01); *H04B 7/15* (2013.01); *H04B 17/327* (2015.01); *H04B 17/336* (2015.01); *H03G 2201/103* (2013.01); *H03G 2201/106* (2013.01); *H03G 2201/307* (2013.01)

(58) Field of Classification Search
CPC .... H04B 17/40; H04B 17/327; H04B 17/336; H04B 7/15; H04B 17/318; H04B 7/15535; H04B 7/155; H04B 7/15528; H04W 52/367; H04W 52/245; H04W 52/52; H04W 52/241; H04W 52/0245;
(Continued)

(56) References Cited

U.S. PATENT DOCUMENTS 4,776,032 A 10/1988 Odate et al.
5,303,395 A 4/1994 Dayani
(Continued)

FOREIGN PATENT DOCUMENTS

EP 1525678 B1 7/2008

OTHER PUBLICATIONS

3GPP2 C.S0011-B; "Recommended Minimum Performance Standards for cdma2000® Spread Spectrum Mobile Stations"; TIA-98-E; (Dec. 13, 2002); 448 pages; Release B, VI.0, Revision E.
(Continued)

*Primary Examiner* — Andrew Wendell
(74) *Attorney, Agent, or Firm* — Thorpe North & Western, LLP.

(57) ABSTRACT

A technology is described for adjusting repeater gain based on user equipment need. A repeater can be configured to receive a downlink signal strength indicator value of a user equipment (UE) via a wireless connection of the UE with the repeater. The repeater can be further configured to select a threshold value for the downlink signal strength indicator value. The repeater can be further configured to reduce or bypass a downlink repeater gain level when the downlink signal strength indicator value is greater than the threshold value.

13 Claims, 15 Drawing Sheets

(51) Int. Cl.
*H04B 7/14* (2006.01)
*H04B 17/40* (2015.01)
*H04B 17/327* (2015.01)
*H04B 17/336* (2015.01)
*H03G 3/30* (2006.01)
*H04B 7/15* (2006.01)

(58) Field of Classification Search
CPC .................. H04W 52/46; H04W 16/26; H03G 2201/103; H03G 2201/106; H03G 2201/307
See application file for complete search history.

(56) References Cited

U.S. PATENT DOCUMENTS

| | | | |
|---|---|---|---|
| 5,737,687 | A | 4/1998 | Martin et al. |
| 5,777,530 | A | 7/1998 | Nakatuka |
| 5,835,848 | A | 11/1998 | Bi et al. |
| 6,005,884 | A | 12/1999 | Cook et al. |
| 6,711,388 | B1 | 3/2004 | Neitiniemi |
| 6,889,033 | B2 | 5/2005 | Bongfeldt |
| 6,990,313 | B1 | 1/2006 | Yarkosky |
| 7,035,587 | B1 | 4/2006 | Yarkosky |
| 7,221,967 | B2 | 5/2007 | Van Buren et al. |
| 7,974,573 | B2 | 7/2011 | Dean |
| 10,015,717 | B1* | 7/2018 | Oroskar ............... H04W 36/30 |
| 2002/0044594 | A1 | 4/2002 | Bongfeldt |
| 2003/0123401 | A1 | 7/2003 | Dean |
| 2004/0137854 | A1 | 7/2004 | Ge |
| 2004/0146013 | A1 | 7/2004 | Song et al. |
| 2004/0166802 | A1 | 8/2004 | McKay, Sr. et al. |
| 2004/0219876 | A1 | 11/2004 | Baker et al. |
| 2004/0235417 | A1 | 11/2004 | Dean |
| 2005/0118949 | A1 | 6/2005 | Allen et al. |
| 2006/0084379 | A1 | 4/2006 | O'Neill |
| 2007/0071128 | A1 | 3/2007 | Meir et al. |
| 2007/0188235 | A1 | 8/2007 | Dean |
| 2007/0268846 | A1* | 11/2007 | Proctor ............... H04B 7/15535 370/279 |
| 2008/0081555 | A1 | 4/2008 | Kong et al. |
| 2008/0096483 | A1 | 4/2008 | Van Buren et al. |
| 2008/0278237 | A1 | 11/2008 | Blin |
| 2011/0151775 | A1 | 6/2011 | Kang et al. |
| 2011/0281579 | A1* | 11/2011 | Kummetz ............ H04B 7/2606 455/424 |
| 2012/0315894 | A1* | 12/2012 | Dussmann .......... H04B 7/15528 455/424 |
| 2013/0077502 | A1* | 3/2013 | Gainey ............... H04B 7/15578 370/252 |
| 2016/0165599 | A1* | 6/2016 | Xu ........................ H04L 5/006 370/315 |
| 2016/0286565 | A1* | 9/2016 | Kim ...................... H04W 72/02 |
| 2017/0055215 | A1 | 2/2017 | Cook et al. |
| 2017/0135117 | A1 | 5/2017 | Raggio et al. |
| 2018/0192365 | A1* | 7/2018 | Feng ................. H04W 72/0453 |
| 2019/0386758 | A1* | 12/2019 | Simons ............... H04B 17/318 |
| 2020/0336278 | A1* | 10/2020 | Ashworth ......... H04W 72/0413 |

OTHER PUBLICATIONS

ADL5513; "1 MHz to 4 GHz, 80 dB Logarithmic Detector/ Controller"; Data Sheet; (2008); 12 pages; Analog Devices, Inc.
HMC713LP3E; "54 dB, Logarithmic Detector / Controller, 50—8000 MHz"; Data Sheet; (2010); 12 pages.
HMC909LP4E; "RMS Power Detector Single-Ended, DC—5.8 GHz"; Data Sheet; (2010); 21 pages.
PIC16F873; "28/40-Pin 8-Bit CMOS FLASH Microcontrollers"; (2001); Data Sheet; 218 pages.

* cited by examiner

BOOSTER GAIN ADJUSTMENT BASED ON USER EQUIPMENT (UE) NEED

RELATED APPLICATIONS

The present application claims the benefit of U.S. Provisional Patent Application No. 62/743,466 filed Oct. 9, 2018, the entire specification of which is hereby incorporated by reference in its entirety for all purposes.

BACKGROUND

Repeaters can be used to increase the quality of wireless communication between a wireless device and a wireless communication access point, such as a cell tower. Repeaters can increase the quality of the wireless communication by amplifying, filtering, and/or applying other processing techniques to uplink and downlink signals communicated between the wireless device and the wireless communication access point.

As an example, the repeater can receive, via an antenna, downlink signals from the wireless communication access point. The repeater can amplify the downlink signal and then provide an amplified downlink signal to the wireless device. In other words, the repeater can act as a relay between the wireless device and the wireless communication access point. As a result, the wireless device can receive a stronger signal from the wireless communication access point. Similarly, uplink signals from the wireless device (e.g., telephone calls and other data) can be directed to the repeater. The repeater can amplify the uplink signals before communicating, via the antenna, the uplink signals to the wireless communication access point.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
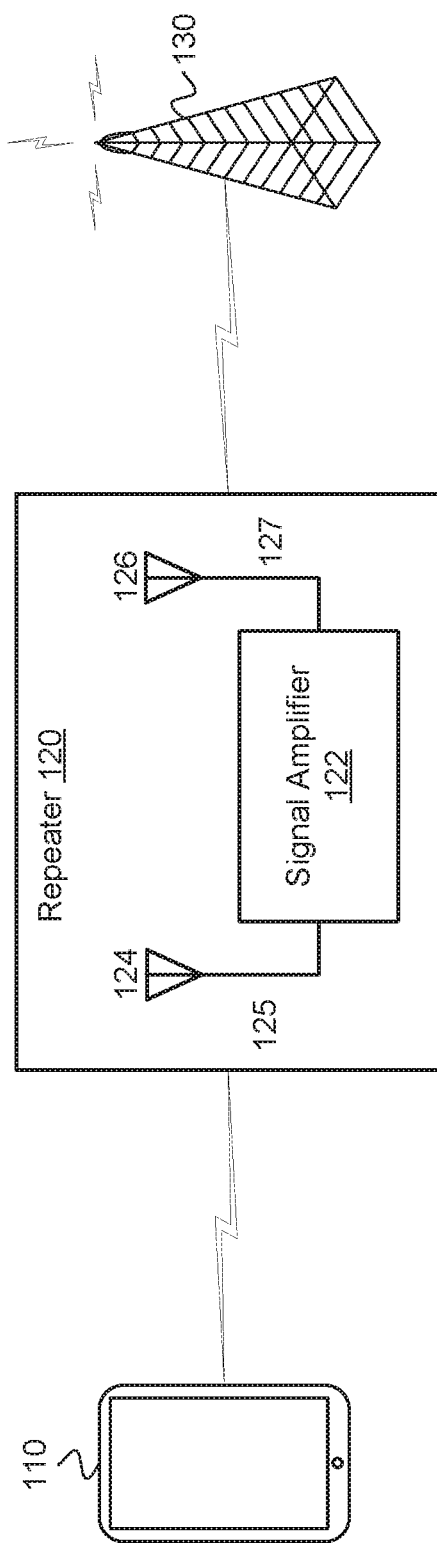
FIG. 1 illustrates a repeater in communication with a wireless device and a base station in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

EXAMPLE EMBODIMENTS

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

FIG. 1 illustrates an exemplary repeater 120 in communication with a wireless device 110 and a base station 130. The repeater 120 (also referred to as a cellular signal amplifier) can increase the quality of wireless communication by amplifying, filtering, and/or applying other processing techniques via a signal amplifier 122 to uplink signals communicated from the wireless device 110 to the base station 130 and/or downlink signals communicated from the base station 130 to the wireless device 110. In other words, the repeater 120 can amplify or boost uplink signals and/or downlink signals bi-directionally. In one example, the repeater 120 can be at a fixed location, such as in a home or office. Alternatively, the repeater 120 can be attached to a mobile object, such as a vehicle or a wireless device 110. The repeater 120 can be a signal booster, such as a cellular signal booster.

In one configuration, the repeater 120 can be configured to be connected to a device antenna 124 (e.g., an inside antenna, server antenna, or a coupling antenna) and a node antenna 126 (e.g., an outside antenna or donor antenna). The node antenna 126 can receive the downlink signal from the base station 130. The downlink signal can be provided to the signal amplifier 122 via a second coaxial cable 127 or other type of wired or wireless, optical or radio frequency connection operable to communicate radio frequency signals. The signal amplifier 122 can include one or more radio signal amplifiers for amplification and filtering of cellular signals. The downlink signal that has been amplified and filtered can be provided to the device antenna 124 via a first coaxial cable 125 or other type of radio frequency connection operable to communicate radio frequency signals. The device antenna 124 can wirelessly communicate the downlink signal that has been amplified and filtered to the wireless device 110.

Similarly, the device antenna 124 can receive an uplink signal from the wireless device 110. The uplink signal can be provided to the signal amplifier 122 via the first coaxial cable 125 or other type of wired or wireless, optical or radio frequency connection operable to communicate radio frequency signals. The signal amplifier 122 can include one or more radio signal amplifiers for amplification and filtering of cellular signals. The uplink signal that has been amplified and filtered can be provided to the node antenna 126 via the second coaxial cable 127 or other type of wired or wireless optical or radio frequency connection operable to communicate radio frequency signals. The node antenna 126 can communicate the uplink signal that has been amplified and filtered to a node, such as base station 130.

In one embodiment, the device antenna 124 and the node antenna 126 can be integrated as part of the repeater 120. Alternatively, the repeater 120 can be configured to be connected to a separate device antenna 124 or node antenna 126. The device antenna and the node antenna may be provided by a different provider than the repeater 120.

In one example, the repeater 120 can send uplink signals to a node and/or receive downlink signals from the node. While FIG. 1 shows the node as a base station 120, this is not intended to be limiting. The node can comprise a wireless wide area network (WWAN) access point (AP), a base station (BS), an evolved Node B (eNB), a next generation Node B (gNB), a baseband unit (BBU), a remote radio head (RRH), a remote radio equipment (RRE), a relay station (RS), a radio equipment (RE), a remote radio unit (RRU), a central processing module (CPM), or another type of WWAN access point.

In one configuration, the repeater 120 used to amplify the uplink and/or a downlink signal can be a handheld booster. The handheld booster can be implemented in a sleeve configured to receive the wireless device 110. The wireless device sleeve may be attached to the wireless device 110, but may be removed as needed. In this configuration, the repeater 120 can automatically power down or cease amplification when the wireless device 110 approaches a particular base station. In other words, the repeater 120 may determine to stop performing signal amplification when the quality of uplink and/or downlink signals is above a defined threshold based on a location of the wireless device 110 in relation to the base station 130.

In one example, the repeater 120 can include a battery to provide power to various components, such as the signal amplifier 122, the device antenna 124 and the node antenna 126. The battery can also power the wireless device 110 (e.g., phone or tablet). Alternatively, the repeater 120 can receive power from the wireless device 110.

In one configuration, the repeater 120 can be a Federal Communications Commission (FCC)-compatible consumer repeater. As a non-limiting example, the repeater 120 can be compatible with FCC Part 20 or 47 Code of Federal Regulations (C.F.R.) Part 20.21 (Mar. 21, 2013). In addition, the handheld booster can operate on the frequencies used for the provision of subscriber-based services under parts 22 (Cellular), 24 (Broadband PCS), 27 (AWS-1, 700 megahertz (MHz) Lower A-E Blocks, and 700 MHz Upper C Block), and 90 (Specialized Mobile Radio) of 47 C.F.R. The repeater 120 can be configured to automatically self-monitor its operation to ensure compliance with applicable noise and gain limits. The repeater 120 can either self-correct or shut down automatically if the repeater's operations violate the regulations defined in 47 CFR Part 20.21. It should be noted that these FCC regulations apply to FCC-compatible consumer repeaters and are not applicable to a user equipment (UE) in communication with an FCC-compatible consumer repeater. While a repeater that is compatible with FCC regulations is provided as an example, it is not intended to be limiting. The repeater can be configured to be compatible with other governmental regulations based on the location where the repeater is configured to operate.

In one configuration, the repeater 120 can enhance the wireless connection between the wireless device 110 and the base station 130 (e.g., cell tower) or another type of wireless wide area network (WWAN) access point (AP) by amplifying desired signals relative to a noise floor.

In one configuration, the repeater 120 can enhance the wireless connection between the wireless device 110 and the base station 130 (e.g., cell tower) or another type of wireless wide area network (WWAN) access point (AP) by amplifying desired signals relative to a noise floor. The repeater 120 can boost signals for cellular standards, such as the Third Generation Partnership Project (3GPP) Long Term Evolution (LTE) Release 8, 9, 10, 11, 12, 13, 14, 15, or 16 standards or Institute of Electronics and Electrical Engineers (IEEE) 802.16. In one configuration, the repeater 120 can boost signals for 3GPP LTE Release 16.3.0 (September 2019) or other desired releases.

The repeater 120 can boost signals from the 3GPP Technical Specification (TS) 36.101 (Release 16 September 2019) bands or LTE frequency bands. For example, the repeater 120 can boost signals from the LTE frequency bands: 2, 4, 5, 12, 13, 17, 25, and 26. In addition, the repeater 120 can boost selected frequency bands based on the country or region in which the repeater is used, including any of bands 1-85 or other bands, as disclosed in 3GPP TS 36.104 V16.3.0 (September 2019), and depicted in Table 1:

TABLE 1

| LTE Operating Band | Uplink (UL) operating band BS receive UE transmit $F_{UL\_low}$-$F_{UL\_high}$ | Downlink (DL) operating band BS transmit UE receive $F_{DL\_low}$-$F_{DL\_high}$ | Duplex Mode |
|---|---|---|---|
| 1 | 1920 MHz-1980 MHz | 2110 MHz-2170 MHz | FDD |
| 2 | 1850 MHz-1910 MHz | 1930 MHz-1990 MHz | FDD |
| 3 | 1710 MHz-1785 MHz | 1805 MHz-1880 MHz | FDD |
| 4 | 1710 MHz-1755 MHz | 2110 MHz-2155 MHz | FDD |
| 5 | 824 MHz-849 MHz | 869 MHz-894MHz | FDD |
| 6 (NOTE 1) | 830 MHz-840 MHz | 875 MHz-885 MHz | FDD |
| 7 | 2500 MHz-2570 MHz | 2620 MHz-2690 MHz | FDD |
| 8 | 880 MHz-915 MHz | 925 MHz-960 MHz | FDD |
| 9 | 1749.9 MHz-1784.9 MHz | 1844.9 MHz-1879.9 MHz | FDD |
| 10 | 1710 MHz-1770 MHz | 2110 MHz-2170 MHz | FDD |
| 11 | 1427.9 MHz-1447.9 MHz | 1475.9 MHz-1495.9 MHz | FDD |
| 12 | 699 MHz-716 MHz | 729 MHz-746 MHz | FDD |
| 13 | 777 MHz-787 MHz | 746 MHz-756 MHz | FDD |

TABLE 1-continued

| LTE Operating Band | Uplink (UL) operating band BS receive UE transmit $F_{UL\_low}$-$F_{UL\_high}$ | Downlink (DL) operating band BS transmit UE receive $F_{DL\_low}$-$F_{DL\_high}$ | Duplex Mode |
|---|---|---|---|
| 14 | 788 MHz-798 MHz | 758 MHz-768 MHz | FDD |
| 15 | Reserved | Reserved | FDD |
| 16 | Reserved | Reserved | FDD |
| 17 | 704 MHz-716 MHz | 734 MHz-746 MHz | FDD |
| 18 | 815 MHz-830 MHz | 860 MHz-875 MHz | FDD |
| 19 | 830 MHz-845 MHz | 875 MHz-890 MHz | FDD |
| 20 | 832 MHz-862 MHz | 791 MHz-821 MHz | FDD |
| 21 | 1447.9 MHz-1462.9 MHz | 1495.9 MHz-1510.9 MHz | FDD |
| 22 | 3410 MHz-3490 MHz | 3510 MHz-3590 MHz | FDD |
| 23[1] | 2000 MHz-2020 MHz | 2180 MHz-2200 MHz | FDD |
| 24 | 1626.5 MHz-1660.5 MHz | 1525 MHz-1559 MHz | FDD |
| 25 | 1850 MHz-1915 MHz | 1930 MHz-1995 MHz | FDD |
| 26 | 814 MHz-849 MHz | 859 MHz-894 MHz | FDD |
| 27 | 807 MHz-824 MHz | 852 MHz-869 MHz | FDD |
| 28 | 703 MHz-748 MHz | 758 MHz-803 MHz | FDD |
| 29 | N/A | 717 MHz-728 MHz | FDD (NOTE 2) |
| 30 | 2305 MHz-2315 MHz | 2350 MHz-2360 MHz | FDD |
| 31 | 452.5 MHz-457.5 MHz | 462.5 MHz-467.5 MHz | FDD |
| 32 | N/A | 1452 MHz-1496 MHz | FDD (NOTE 2) |
| 33 | 1900 MHz-1920 MHz | 1900 MHz-1920 MHz | TDD |
| 34 | 2010 MHz-2025 MHz | 2010 MHz-2025 MHz | TDD |
| 35 | 1850 MHz-1910 MHz | 1850 MHz-1910 MHz | TDD |
| 36 | 1930 MHz-1990 MHz | 1930 MHz-1990 MHz | TDD |
| 37 | 1910 MHz-1930 MHz | 1910 MHz-1930 MHz | TDD |
| 38 | 2570 MHz-2620 MHz | 2570 MHz-2620 MHz | TDD |
| 39 | 1880 MHz-1920 MHz | 1880 MHz-1920 MHz | TDD |
| 40 | 2300 MHz-2400 MHz | 2300 MHz-2400 MHz | TDD |
| 41 | 2496 MHz-2690 MHz | 2496 MHz-2690 MHz | TDD |
| 42 | 3400 MHz-3600 MHz | 3400 MHz-3600 MHz | TDD |
| 43 | 3600 MHz-3800 MHz | 3600 MHz-3800 MHz | TDD |
| 44 | 703 MHz-803 MHz | 703 MHz-803 MHz | TDD |
| 45 | 1447 MHz-1467 MHz | 1447 MHz-1467 MHz | TDD |
| 46 | 5150 MHz-5925 MHz | 5150 MHz-5925 MHz | TDD (NOTE 3, NOTE 4) |
| 47 | 5855 MHz-5925 MHz | 5855 MHz-5925 MHz | TDD |
| 48 | 3550 MHz-3700 MHz | 3550 MHz-3700 MHz | TDD |
| 49 | 3550 MHz-3700 MHz | 3550 MHz-3700 MHz | TDD (NOTE 8) |
| 50 | 1432 MHz-1517 MHz | 1432 MHz-1517 MHz | TDD |
| 51 | 1427 MHz-1432 MHz | 1427 MHz-1432 MHz | TDD |
| 52 | 3300 MHz-3400 MHz | 3300 MHz-3400 MHz | TDD |
| 53 | 2483.5 MHz-2495 MHz | 2483.5 MHz-2495 MHz | TDD |
| 65 | 1920 MHz-2010 MHz | 2110 MHz-2200 MHz | FDD |
| 66 | 1710 MHz-1780 MHz | 2110 MHz-2200 MHz | FDD (NOTE 5) |
| 67 | N/A | 738 MHz-758 MHz | FDD (NOTE 2) |
| 68 | 698 MHz-728 MHz | 753 MHz-783 MHz | FDD |
| 69 | N/A | 2570 MHz-2620 MHz | FDD (NOTE 2) |
| 70 | 1695 MHz-1710 MHz | 1995 MHz-2020 MHz | FDD[6] |
| 71 | 663 MHz-698 MHz | 617 MHz-652 MHz | FDD |
| 72 | 451 MHz-456 MHz | 461 MHz-466 MHz | FDD |
| 73 | 450 MHz-455 MHz | 460 MHz-465 MHz | FDD |
| 74 | 1427 MHz-1470 MHz | 1475 MHz-1518 MHz | FDD |
| 75 | N/A | 1432 MHz-1517 MHz | FDD (NOTE 2) |
| 76 | N/A | 1427 MHz-1432 MHz | FDD (NOTE 2) |
| 85 | 698 MHz-716 MHz | 728 MHz-746 MHz | FDD |
| 87 | 410 MHz-415 MHz | 420 MHz-425 MHz | FDD |
| 88 | 412 MHz-417 MHz | 422 MHz-427 MHz | FDD |

NOTE 1: Band 6, 23 are not applicable.
NOTE 2: Restricted to E-UTRA operation when carrier aggregation is configured. The downlink operating band is paired with the uplink operating band (external) of the carrier aggregation configuration that is supporting the configured Pcell.
NOTE 3: This band is an unlicensed band restricted to licensed-assisted operation using Frame Structure Type 3.
NOTE 4: Band 46 is divided into four sub-bands as in Table 5.5-1A.
NOTE 5: The range 2180-2200 MHz of the DL operating band is restricted to E-UTRA operation when carrier aggregation is configured.
NOTE 6: The range 2010-2020 MHz of the DL operating band is restricted to E-UTRA operation when carrier aggregation is configured and TX-RX separation is 300 MHz. The range 2005-2020 MHz of the DL operating band is restricted to E-UTRA operation when carrier aggregation is configured and TX-RX separation is 295 MHz.
NOTE 7: Void
NOTE 8: This band is restricted to licensed-assisted operation using Frame Structure Type 3.

In another configuration, the repeater 120 can boost signals from the 3GPP Technical Specification (TS) 38.104 (Release 16 September 2019) bands or 5G frequency bands. In addition, the repeater 120 can boost selected frequency bands based on the country or region in which the repeater is used, including any of bands n1-n86 in frequency range 1 (FR1), n25-n261 in frequency range 2 (FR2), or other bands, as disclosed in 3GPP TS 38.104 V16.1.0 (September 2019), and depicted in Table 2 and Table 3:

TABLE 2

| NR operating band | Uplink (UL) operating band BS receive/ UE transmit $F_{UL,low}$-$F_{UL,high}$ | Downlink (DL) operating band BS transmit/ UE receive $F_{DL,low}$-$F_{DL,high}$ | Duplex mode |
|---|---|---|---|
| n1 | 1920 MHz-1980 MHz | 2110 MHz-2170 MHz | FDD |
| n2 | 1850 MHz-1910 MHz | 1930 MHz-1990 MHz | FDD |
| n3 | 1710 MHz-1785 MHz | 1805 MHz-1880 MHz | FDD |
| n5 | 824 MHz-849 MHz | 869 MHz-894 MHz | FDD |
| n7 | 2500 MHz-2570 MHz | 2620 MHz-2690 MHz | FDD |
| n8 | 880 MHz-915 MHz | 925 MHz-960 MHz | FDD |
| n12 | 699 MHz-716 MHz | 729 MHz-746 MHz | FDD |
| n14 | 788 MHz-798 MHz | 758 MHz-768 MHz | FDD |
| n18 | 815 MHz-830 MHz | 860 MHz-875 MHz | FDD |
| n20 | 832 MHz-862 MHz | 791 MHz-821 MHz | FDD |
| n25 | 1850 MHz-1915 MHz | 1930 MHz-1995 MHz | FDD |
| n28 | 703 MHz-748 MHz | 758 MHz-803 MHz | FDD |
| n29 | N/A | 717 MHz-728 MHz | SDL |
| n30 | 2305 MHz-2315 MHz | 2350 MHz-2360 MHz | FDD |
| n34 | 2010 MHz-2025 MHz | 2010 MHz-2025 MHz | TDD |
| n38 | 2570 MHz-2620 MHz | 2570 MHz-2620 MHz | TDD |
| n39 | 1880 MHz-1920 MHz | 1880 MHz-1920 MHz | TDD |
| n40 | 2300 MHz-2400 MHz | 2300 MHz-2400 MHz | TDD |
| n41 | 2496 MHz-2690 MHz | 2496 MHz-2690 MHz | TDD |
| n48 | 3550 MHz-3700 MHz | 3550 MHz-3700 MHz | TDD |
| n50 | 1432 MHz-1517 MHz | 1432 MHz-1517 MHz | TDD |
| n51 | 1427 MHz-1432 MHz | 1427 MHz-1432 MHz | TDD |
| n65 | 1920 MHz-2010 MHz | 2110 MHz-2200 MHz | FDD |
| n66 | 1710 MHz-1780 MHz | 2110 MHz-2200 MHz | FDD |
| n70 | 1695 MHz-1710 MHz | 1995 MHz-2020 MHz | FDD |
| n71 | 663 MHz-698 MHz | 617 MHz-652 MHz | FDD |
| n74 | 1427 MHz-1470 MHz | 1475 MHz-1518 MHz | FDD |
| n75 | N/A | 1432 MHz-1517 MHz | SDL |
| n76 | N/A | 1427 MHz-1432 MHz | SDL |
| n77 | 3300 MHz-4200 MHz | 3300 MHz-4200 MHz | TDD |
| n78 | 3300 MHz-3800 MHz | 3300 MHz-3800 MHz | TDD |
| n79 | 4400 MHz-5000 MHz | 4400 MHz-5000 MHz | TDD |
| n80 | 1710 MHz-1785 MHz | N/A | SUL |
| n81 | 880 MHz-915 MHz | N/A | SUL |
| n82 | 832 MHz-862 MHz | N/A | SUL |
| n83 | 703 MHz-748 MHz | N/A | SUL |

TABLE 2-continued

| NR operating band | Uplink (UL) operating band BS receive/ UE transmit $F_{UL,low}$-$F_{UL,high}$ | Downlink (DL) operating band BS transmit/ UE receive $F_{DL,low}$-$F_{DL,high}$ | Duplex mode |
|---|---|---|---|
| n84 | 1920 MHz-1980 MHz | N/A | SUL |
| n86 | 1710 MHz-1780 MHz | N/A | SUL |
| n89 | 824 MHz-849 MHz | N/A | SUL |
| [n90] | 2496 MHz-2690 MHz | 2496 MHz-2690 MHz | TDD |

TABLE 3

| NR operating band | Uplink (UL) and Downlink (DL) operating band BS transmit/receive UE transmit/receive $F_{UL,low}$-$F_{UL,high}$ $F_{DL,low}$-$F_{DL,high}$ | Duplex mode |
|---|---|---|
| n257 | 26500 MHz-29500 MHz | TDD |
| n258 | 24250 MHz-27500 MHz | TDD |
| n260 | 37000 MHz-40000 MHz | TDD |
| n261 | 27500 MHz-28350 MHz | TDD |

The number of LTE or 5G frequency bands and the level of signal enhancement can vary based on a particular wireless device, cellular node, or location. Additional domestic and international frequencies can also be included to offer increased functionality. Selected models of the repeater 120 can be configured to operate with selected frequency bands based on the location of use. In another example, the repeater 120 can automatically sense from the wireless device 110 or base station 130 (or GPS, etc.) which frequencies are used, which can be a benefit for international travelers.

A repeater 120 can amplify or boost uplink signals and/or downlink signals bi-directionally. However, when a downlink signal from a cellular node or base station has a relatively high power, boosting or amplifying the downlink signal can introduce too much noise into the system. The noise introduced into the system is not easily eliminated.

In one example, a repeater can adjust gain based on a user equipment need to reduce the introduction of noise into the system. The repeater can be configured to receive a downlink signal strength indicator value of a user equipment (UE) via a wireless connection of the UE with the repeater. The repeater can be configured to select a threshold value for the downlink signal strength indicator value. The repeater can be configured to reduce or bypass a downlink repeater gain level when the downlink signal strength indicator value is greater than the threshold value.

In another example, a machine readable storage medium can have instructions embodied thereon for adjusting repeater gain based on UE need to reduce the introduction of noise into the system. The instructions, when executed by one or more processors at the UE, can perform the following: identifying a distance of the UE relative to a base station of the UE. The instructions, when executed by one or more processors at the UE, can perform the following: reducing or bypassing a repeater gain level when the location of the UE is less than a selected distance.

In another example, a machine readable storage medium can have instructions embodied thereon for adjusting repeater gain based on UE need to reduce the introduction of noise into the system. The instructions, when executed by one or more processors at the UE, can perform the following: deactivating a downlink amplification path of a repeater; identifying a deactivated throughput value for data received at the UE in a selected time period; activating the downlink amplification path of the repeater; identifying an activated throughput value for data received at the UE in the selected time period; determining a difference between the deactivated throughput value and the activated throughput value; and reducing or bypassing a repeater gain value on the downlink amplification path when the deactivated throughput value is greater than the activated throughput value by a selected threshold value.

Figure 2:
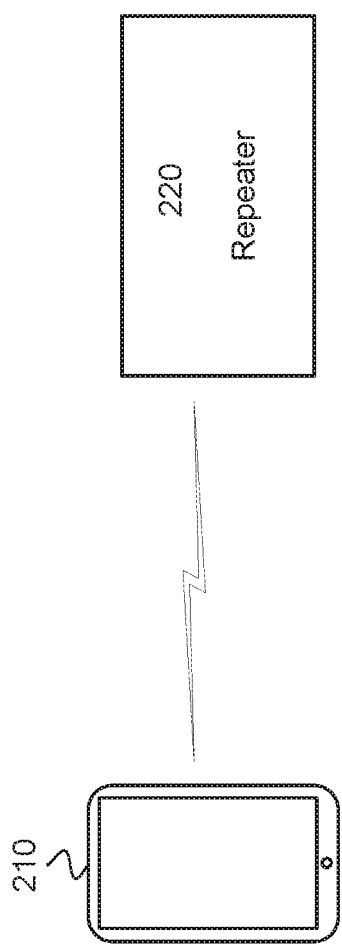
FIG. 2 illustrates a repeater in communication with a wireless device in accordance with an example.

As illustrated in FIG. 2, a cellular signal booster or repeater 220 can be configured to receive a downlink signal strength indicator value of a user equipment (UE) 210 via a wireless connection of the UE 210 with the repeater 220. The wireless connection of the UE 210 with the repeater 220 can be one or more of a wireless personal area network (W-PAN), which can include a Bluetooth v4.0, Bluetooth Low Energy, Bluetooth v4.1, Bluetooth v4.2, Bluetooth v5.0, or Bluetooth v5.1 configured RAT, or a wireless local area network (W-LAN), which can include an Institute of Electronics and Electrical Engineers (IEEE) 802.11a, IEEE 802.11b, IEEE 802.11g, IEEE 802.11n, IEEE 802.11ac, or IEEE 802.11ad, or IEEE 802.11ax configured RAT. The repeater 220 can be configured to communicate with the UE 210 through a direct connection, a Near-Field Communication (NFC) configured radio access technology (RAT), an Ultra High Frequency (UHF) configured RAT, a TV White Space Band (TVWS) configured RAT, or any other industrial, scientific and medical (ISM) radio band configured RAT. Examples of such ISM bands include 2.4 GHz, 3.6 GHz, 4.9 GHz, 5 GHz, 5.9 GHz, or 6.1 GHz.

In another example, the downlink signal strength indicator value can be one or more of: a received signal strength indicator (RSSI), measured at the UE; a signal to noise ratio (SNR) measured at the UE, a reference signal received power (RSRP), measured at the UE; a reference signal received quality (RSRQ), measured at the UE; a received signal code power (RSCP), measured at the UE; an arbitrary strength unit (ASU), measured at the UE; or a channel quality indicator (CQI), measured at the UE.

The received signal strength indicator can be a measurement of the relative received signal strength and can be an indication of the power level of a received radio signal. The RSSI can be expressed in arbitrary units. The RSSI measured at a UE can be the power level of a received radio signal at the UE at a provided time. The RSSI value can have a threshold value. The repeater can be configured to select this threshold value based on the UE need. When the value of the RSSI is higher than a threshold value, the repeater 220 can be configured to adjust a repeater gain level. The repeater 220 can be configured to adjust the repeater gain level by: reducing the uplink or downlink repeater gain level or bypassing the uplink or downlink repeater gain for a received uplink signal or received downlink signal, respectively.

The signal to noise ratio can be a measurement of the level of a desired signal to the level of background noise. SNR can be expressed as the ratio of the power of a signal and the power of the background noise. The SNR measured at a UE can be the ratio of the power level of a desired signal and the power of the noise at a provided time. The SNR value can have a threshold value. The repeater can be configured to select this threshold value based on the UE need. When the value of the SNR is higher than a threshold value, the repeater 220 can be configured to adjust a repeater gain level. The repeater 220 can be configured to adjust the repeater gain level by: reducing the uplink or downlink repeater gain level or bypassing the uplink or downlink repeater gain level for a received uplink signal or received downlink signal, respectively.

The reference signal received power can be a measurement of the linear average of reference signal power across a specified bandwidth. RSRP can provide the signal strength of a desired signal without providing information about the quality of the desired signal. The RSRP measured at a UE can be the linear average of reference signal power within a measurement frequency bandwidth. The RSRP can have a threshold value. The repeater can be configured to select this threshold value based on the UE need. When the value of the RSRP is higher than a threshold value, the repeater 220 can be configured to adjust a repeater gain level. The repeater 220 can be configured to adjust the repeater gain level by: reducing the uplink or downlink repeater gain level or bypassing the uplink or downlink repeater gain level for a received uplink signal or received downlink signal, respectively.

The reference signal received quality can be a measurement of the quality of the received reference signal. The RSRQ can be defined as:

$$RSRQ = N * \left(\frac{RSRP}{RSSI}\right),$$

where N is equal to the number of physical resource blocks over which the RSSI is measured, which can be equal to the system bandwidth. The RSRQ can have a threshold value. The repeater can be configured to select this threshold value based on the UE need. When the value of the RSRQ is higher than a threshold value, the repeater 220 can be configured to adjust a repeater gain level. The repeater 220 can be configured to adjust the repeater gain level by: reducing the uplink or downlink repeater gain level or bypassing the uplink or downlink repeater gain level for a received uplink signal or received downlink signal, respectively.

The received signal code power can be a measurement of the power measured by a receiver on a particular communication channel in the universal mobile telecommunications system (UMTS). The RSCP measured at a UE can be the power measured at the UE on a particular communication channel. The RSCP can have a threshold value. The repeater can be configured to select this threshold value based on the UE need. When the value of the RSCP is higher than a threshold value, the repeater 220 can be configured to adjust a repeater gain level. The repeater 220 can be configured to adjust the repeater gain level by: reducing the uplink or downlink repeater gain level or bypassing the uplink or downlink repeater gain level for a received uplink signal or received downlink signal, respectively.

An arbitrary strength unit (ASU) can be an integer value proportional to the received signal strength measured by a UE. The ASU can have a threshold value. The repeater can be configured to select this threshold value based on the UE need. When the value of the ASU is higher than a threshold value, the repeater 220 can be configured to adjust a repeater gain level. The repeater 220 can be configured to adjust the repeater gain level by: reducing the uplink or downlink repeater gain level or bypassing the uplink or downlink repeater gain level for a received uplink signal or received downlink signal, respectively.

A channel quality indicator can be an indicator regarding the quality of the information of a communication channel. The CQI can be measured at a UE. The CQI can have a threshold value. The repeater can be configured to select this threshold value based on the UE need. When the value of the CQI is higher than a threshold value, the repeater 220 can be configured to adjust a repeater gain level. The repeater 220 can be configured to adjust the repeater gain level by: reducing the uplink or downlink repeater gain level or bypassing the uplink or downlink repeater gain level for a received uplink signal or received downlink signal, respectively.

Figure 3:
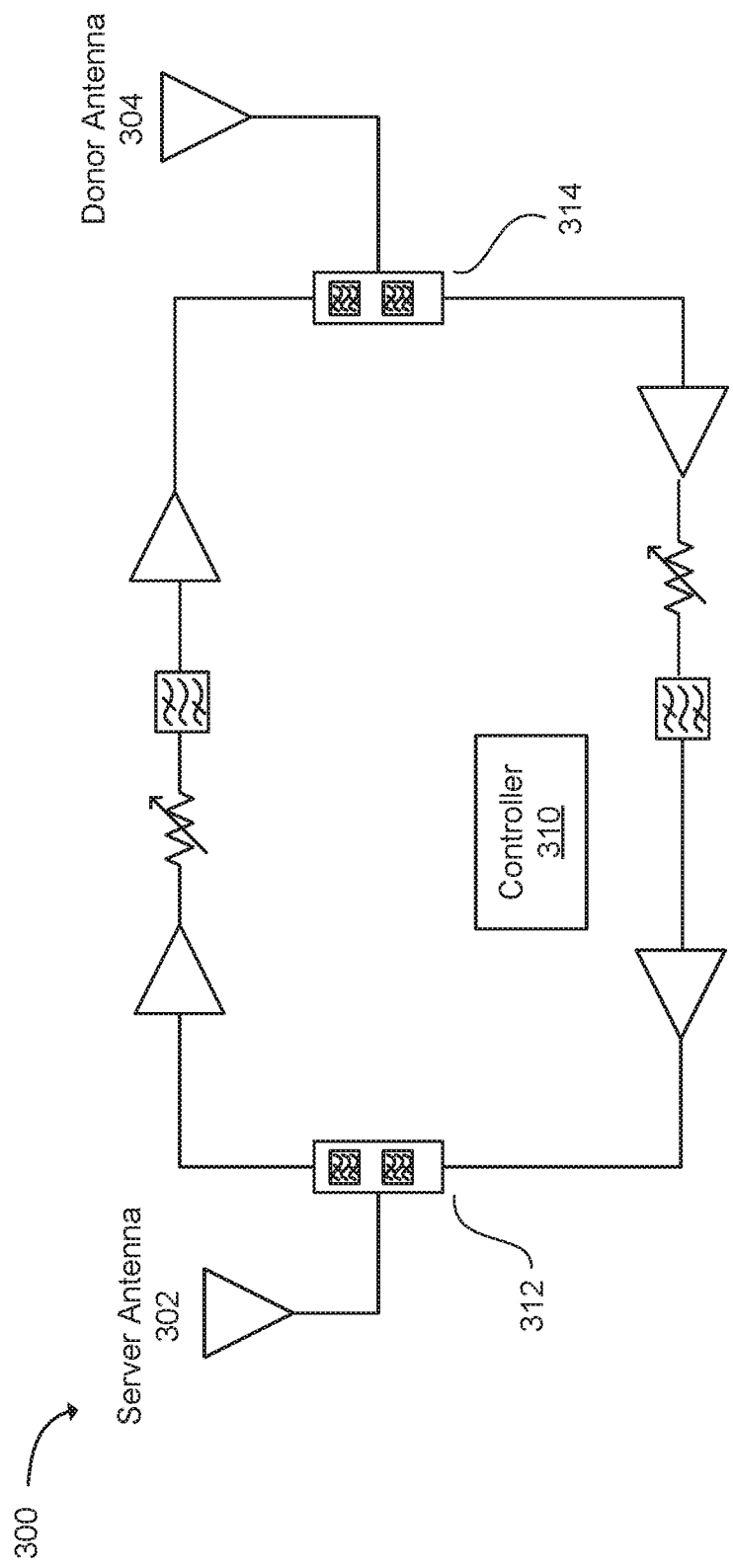
FIG. 3 illustrates a repeater in accordance with an example.

As illustrated in FIG. 3, a repeater 300 can comprise a server antenna 302 and a donor antenna 304. The server antenna 302, also referred to as an inside antenna, can be coupled to a first diplexer or duplexer 312. The donor antenna 314, also referred to as an outside antenna, can be coupled to a second diplexer or duplexer 314. A first path can comprise a low noise amplifier (LNA) with an input coupled to the first diplexer, a variable attenuator coupled to an output of the LNA, a filter coupled to the variable attenuator, and a power amplifier (PA) coupled between the filter and the second diplexer. The LNA can amplify a low power signal without degrading the signal to noise ratio. A PA can adjust and amplify the power level by a desired amount. A second path can comprise an LNA with an input coupled to the second diplexer, a variable attenuator coupled to an output of the LNA, a filter coupled to the variable attenuator, and a PA coupled between the filter and the first diplexer. The first path can be a downlink amplification path or an uplink amplification path. The second path can be a downlink amplification path or an uplink amplification path. The repeater 300 can also comprise a controller 310. In one example, the controller 310 can include one or more processors and memory.

In another example, the repeater 300 can be configured to adjust the repeater gain level. The repeater gain level can be adjusted by adjusting the gain of one or more amplifiers in one or more of a downlink amplification path or an uplink amplification path of the repeater. The gain can be adjusted by increasing the gain or reducing the gain. In one embodiment, the amplifiers may be constant gain amplifiers. Variable attenuators can be used to increase or reduce an attenuation at one or more of the attenuators in the signal booster to increase or reduce the gain.

In another example, the repeater 300 can be configured to adjust the repeater gain level by adjusting an attenuation in one or more amplifiers in one or more of a downlink amplification path or an uplink amplification path of the repeater. The gain can be adjusted by increasing the gain or reducing the gain. In one embodiment, the amplifiers may be constant gain amplifiers. Variable attenuators can be used to increase or reduce an attenuation at one or more of the attenuators in the signal booster to increase or reduce the gain.

In another example, the repeater 300 can be configured to adjust the repeater gain level by enabling, bypassing, or disabling one or more of a downlink amplification path or an uplink amplification path of the repeater.

Figure 4:
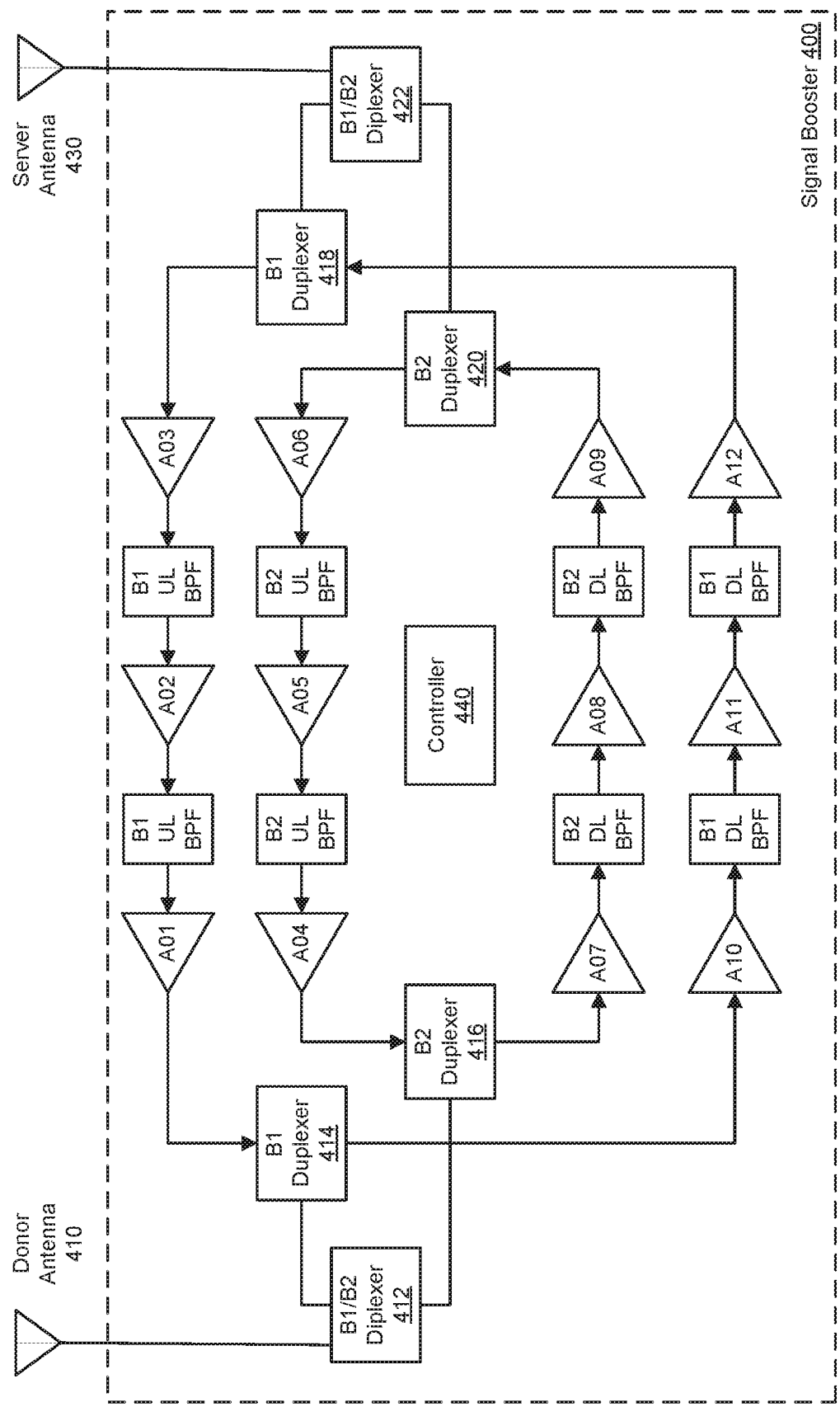
FIG. 4 illustrates a multiband signal booster in accordance with an example.

As illustrated in FIG. 4, in another example, a repeater can be a bi-directional wireless signal booster 400 configured to amplify an uplink signal and a downlink signal simultaneously using a separate signal path for one or more uplink frequency bands and one or more downlink frequency bands. A donor antenna 410, or an integrated node antenna, can receive a downlink signal. For example, the downlink signal can be received from a base station. The downlink signal can be provided to a first B1/B2 diplexer 412, wherein B1 represents a first frequency band and B2 represents a second frequency band. The first B1/B2 diplexer 412 can direct the signals in the B1 and B2 frequency bands to a B1 downlink signal path and a B2 downlink signal path, respectively. A downlink signal that is associated with the B1 frequency band can travel along the B1 downlink signal path to a first B1 duplexer 414, or a downlink signal that is associated with B2 can travel along the B2 downlink signal path to a first B2 duplexer 416. After passing the first B1 duplexer 414, the downlink signal can travel through a series of amplifiers (e.g. A10, A11, and A12) and downlink bandpass filters (B1 DL BPF) to a second B1 duplexer 418. The signal can then be directed by the B1 duplexer 418 to a second B1/B2 diplexer 422. A server antenna 430 may be coupled to the B1/B2 diplexer 422. The signal can be directed by the B1/B2 diplexer 422 to the server antenna 430 for transmission to a wireless device. A signal in the B2 frequency band can travel through the first B1/B2 diplexer 412 and be directed to a B2 duplexer 416. After passing the first B2 duplexer 416, the downlink signal in the B2 frequency band can travel through a series of amplifiers (e.g. A07, A08, and A09) and downlink band pass filters (B2 DL BPF) to a second B2 duplexer 420. The signal can then be directed by the B2 duplexer 416 to a second B1/B2 diplexer 422. A server antenna 430 may be coupled to the B1/B2 diplexer 422. The signal can be directed by the B1/B2 diplexer 422 to the server antenna 430 for transmission to a wireless device, such as a UE.

In another example, the server antenna 430 can receive an uplink (UL) signal from a wireless device. The uplink signal can be provided to the second B1/B2 diplexer 422. The second B1/B2 diplexer 422 can direct the signals in the B1 and B2 frequency bands to a B1 uplink signal path and a B2 uplink signal path, respectively. An uplink signal that is associated with the B1 frequency band can travel along the B1 uplink signal path to a second B1 duplexer 418, or an uplink signal that is associated with B2 can travel along the B2 uplink signal path to a second B2 duplexer 420. After passing the second B1 duplexer 418, the uplink signal can travel through a series of amplifiers (e.g. A01, A02, and A03) and uplink bandpass filters (B1 UL BPF) to the first B1 duplexer 414. The signal can then be directed by the B1 duplexer 414 to a first B1/B2 diplexer 412. A donor antenna 410 may be coupled to the B1/B2 diplexer 412. The signal can be directed by the B1/B2 diplexer 412 to the donor antenna 410 for transmission to a base station. A signal in the B2 frequency band can travel through the second B1/B2 diplexer 422 and be directed to a B2 duplexer 420. After passing the second B2 duplexer 420, the uplink signal in the B2 frequency band can travel through a series of amplifiers (e.g. A04, A05, and A06) and downlink band pass filters (B2 UL BPF) to the first B2 duplexer 416. A donor antenna 410 may be coupled to the B1/B2 diplexer 412. The signal can be directed by the B1/B2 diplexer 412 to the donor antenna 410 for transmission to a base station.

The exemplary signal booster 400 can be configured to adjust the repeater gain level by adjusting the gain of one or more amplifiers in one or more of a downlink amplification path or an uplink amplification path of the repeater. The gain can be adjusted by increasing the gain or reducing the gain. In one embodiment, the amplifiers may be constant gain amplifiers. Variable attenuators can be used to increase or reduce an attenuation at one or more of the attenuators in the signal booster to increase or reduce the gain.

The exemplary signal booster 400 can be configured to adjust the repeater gain level by adjusting an attenuation in one or more amplifiers in one or more of a downlink amplification path or an uplink amplification path of the repeater. The gain can be adjusted by increasing the gain or reducing the gain. In one embodiment, the amplifiers may be constant gain amplifiers. Variable attenuators can be used to increase or reduce an attenuation at one or more of the attenuators in the signal booster to increase or reduce the gain.

The exemplary signal booster 400 can be configured to adjust the repeater gain level by enabling, bypassing, or disabling one or more of a downlink amplification path or an uplink amplification path of the repeater.

Figure 5A:
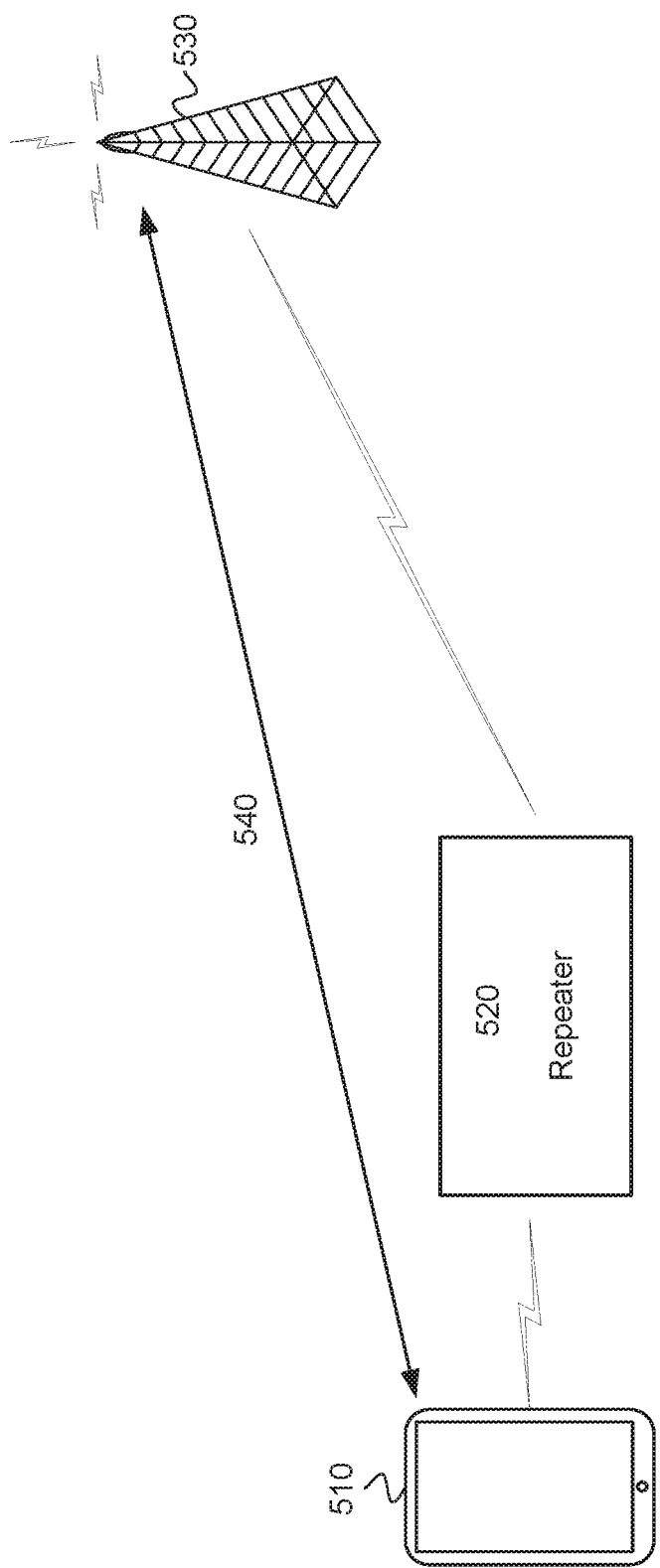
FIG. 5a illustrates a repeater in communication with a wireless device and a base station in accordance with an example.

FIG. 5a illustrates an example of adjusting repeater gain based on UE need with respect to a distance between the UE 510 and a base station 530 of the UE. A UE 510 can be configured to communicate with a cellular signal booster or repeater 520. The cellular signal booster or repeater 520 can be configured to communicate with a base station 530 of the UE. At the UE 510, a distance 540 of the UE can be identified between the UE 510 and the base station 530 of the UE. A repeater gain level can be reduced or bypassed when the location of the UE 510 is less than a selected distance from the base station 530.

Figure 5B:
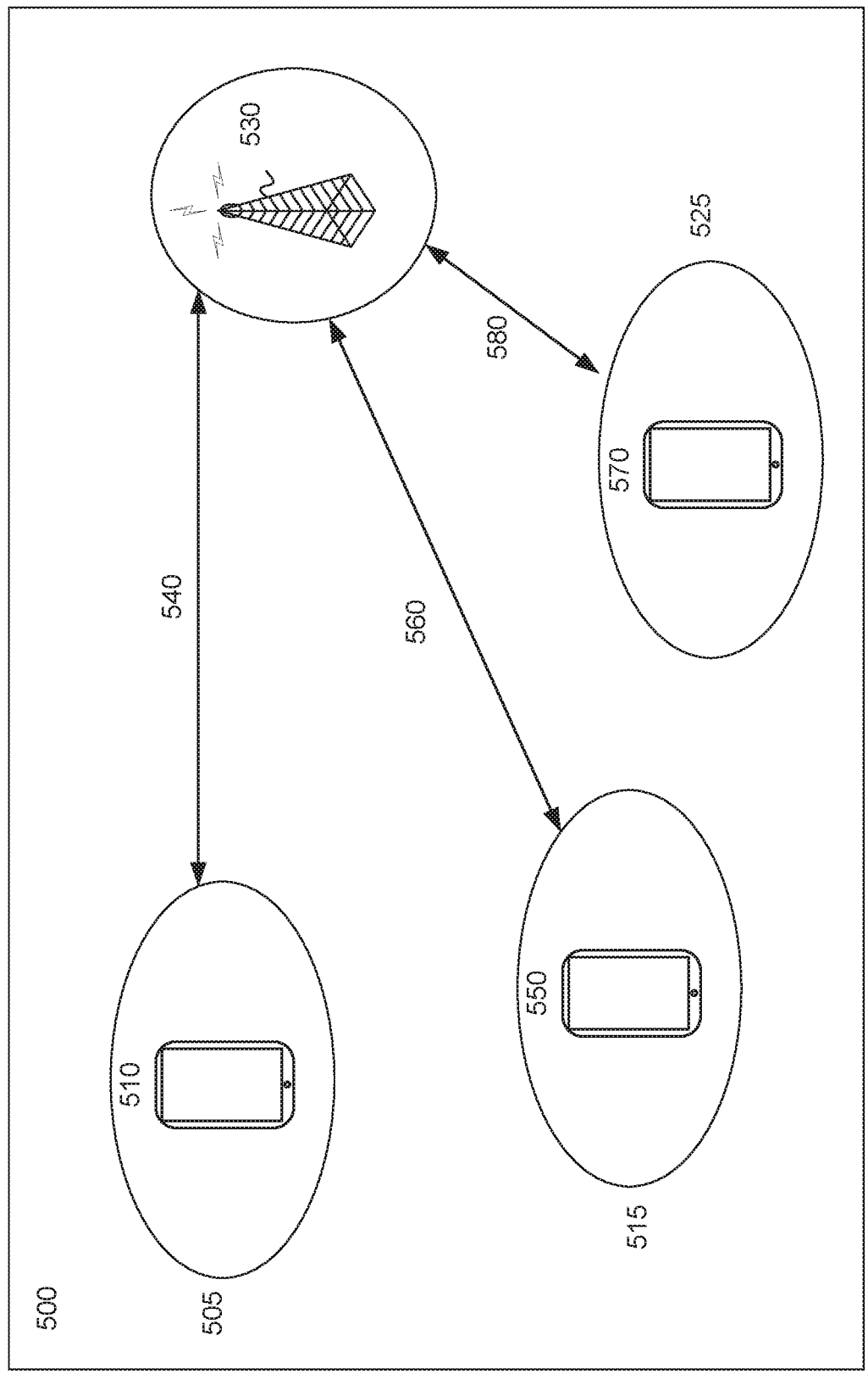
FIG. 5b illustrates wireless devices in communication with a base station in accordance with an example.

FIG. 5b illustrates another example of adjusting repeater gain based on UE need with respect to a distance between a UE and a base station of the UE. In one example, a UE 510 can be in a geographical region 505. For example, this geographical region 505 can be based on natural features such as forests and mountains. A UE located in a particular region of a forest or a particular region of mountains can have signal strength characteristics that are similar throughout the particular region. UE 510 can be configured to communicate with a repeater that is located in the same region. The UE can be configured to identify the distance 540 of the UE relative to the base station 530 of the UE and reducing or bypassing a repeater gain level when the distance 540 of the UE is less than a selected distance.

In another example, a UE 550 can be located in another region 515 such as a desert. This region 515 can have signal strength characteristics that are similar throughout the particular region. UE 550 can be configured to communicate with a repeater that is located in the same region. The UE can be configured to identify the distance 560 of the UE relative to the base station 530 of the UE and reducing or bypassing a repeater gain level when the distance 560 of the UE is less than a selected distance.

In another example, UE 570 can be located in another region 525 such as the interior of a building. This region 525 can have signal strength characteristics that are similar throughout the particular region. UE 570 can be configured to communicate with a repeater that is located in the same region. The UE can be configured to identify the distance 580 of the UE relative to the base station 530 of the UE and reducing or bypassing a repeater gain level when the distance 580 of the UE is less than a selected distance.

In another example, the UE 510, UE 550, and UE 570 can be located in a larger region 500. This larger region can have signal strength characteristics that are similar throughout the particular region. The UE 510, UE 550, and UE 570 can each be configured to communicate with a repeater. Each of the UE 510, UE 550, and UE 570 can be configured to identify a distance 540, 560, and 580 of the UEs relative to the base station 530 of the UE 510, UE 550, and UE 570. Each of the UE 510, UE 550, and UE 570 can reduced or bypass a repeater gain level when the distance 540, 560, and 580 of the UEs is less than a selected distance.

The distance of a UE can be identified by: determining a location of the UE using a location-based service at the UE and determining the distance of the UE based on the UE location relative to the base station. Examples of location-based services include a satellite location system receiver, a cellular location-based service, and a radio-frequency triangulation device. A satellite location system receiver can include global positioning system (GPS), Galileo positioning system, any other global navigation satellite system, and any regional navigation satellite system. A cellular location-based service can include any software-level service that uses location data. A radio-frequency (RF) triangulation device can include any device that can determine location using RF triangulation.

The repeater gain level can be adjusted based on the distance of the UE relative to the base station. The repeater gain level can be reduced by: reducing a gain of one or more amplifiers in an uplink amplification path; increasing an attenuation in an uplink amplification path; turning off one or more amplifiers in an uplink amplification path. The repeater gain level can also be reduced by: reducing a gain of one or more amplifiers in a downlink amplification path; increasing an attenuation in a downlink amplification path; turning off one or more amplifiers in a downlink amplification path.

A UE can be configured to send a signal to a repeater to deactivate a downlink amplification path of a repeater. When the downlink amplification path of the repeater is deactivated, a deactivated throughput value, comprising data that is received at the UE in a selected time period during which the downlink amplification path is deactivated, can be measured and identified at the UE. Throughput can refer to the amount of data moved successfully from one place to another in a provided time period. A UE can be configured to send a signal to a repeater to activate a downlink amplification path of a repeater. When the downlink amplification path of the repeater is activated, an activated throughput value for data received at the UE in a selected time period can be identified by the UE. The UE can be configured to determine a difference between the deactivated throughput value and the activated throughput value. When the deactivated throughput value is greater than the activated throughput value by a selected threshold value, a signal can be sent from the UE to the repeater to deactivate or reduce a repeater gain level of a downlink amplification path of the repeater.

In another example, a user equipment (UE) can receive the amplified downlink (DL) signal from the server antenna (inside antenna) of the repeater. As the UE moves, relative to the server antenna, the UE can be a variable distance from the server antenna of the repeater. There can also be obstacles between the server antenna of the repeater and the UE. The variable distance of the UE, and the changes in obstacles between the UE and the server antenna can result in changes in loss of the downlink signal received at the UE from the server antenna. As the amount of loss between the server antenna and the UE increases due to changes in distance or obstacles located between the UE and the server antenna, additional gain can be needed at the repeater to affect the UE RSSI of the DL signal. The measurement of the RSSI by the UE can be used to adjust the DL gain at the repeater. If the UE is in close proximity to the server antenna or the inside antenna, then the repeater signal can be the dominant signal that the UE receives.

It is noted that the UE RSSI measurement is different from the downlink signal strength indicator measurement made at the repeater, such as a received signal strength indicator measurement that is made at the repeater. The downlink signal strength indicator measurement that is made at the repeater can be used to regulate the amount of amplification, at the repeater, of the base station's downlink signal and/or the UE's uplink signal based on governmental regulations. The UE RSSI measurement can be used for additional purposes, as described herein. However, the UE RSSI measurement typically is not used to regulate the gain of the repeater since the distance between the UE and the server antenna (or the obstacles between the UE and the repeater) is typically not known.

The downlink amplification path of the repeater can be deactivated by one or more of: reducing a gain of one or more amplifiers in the downlink amplification path; increasing an attenuation in the downlink amplification path; or turning off one or more amplifiers in the downlink amplification path.

The downlink amplification path of the repeater can be activated by one or more of: increasing a gain of one or more amplifiers in the downlink amplification path; decreasing an attenuation in the downlink amplification path; or turning on one or more amplifiers in the downlink amplification path.

The uplink amplification path of the repeater can be deactivated by one or more of: reducing a gain of one or more amplifiers in the uplink amplification path; increasing an attenuation in the uplink amplification path; or turning off one or more amplifiers in the uplink amplification path.

The uplink amplification path of the repeater can be activated by one or more of: increasing a gain of one or more amplifiers in the uplink amplification path; decreasing an attenuation in the uplink amplification path; or turning on one or more amplifiers in the uplink amplification path.

A repeater can be configured to deactivate a downlink amplification path of a repeater. When the downlink amplification path of the repeater is deactivated, a deactivated throughput value for data received at the UE in a selected time period can be identified by the repeater. A repeater can be configured to activate a downlink amplification path of a repeater. When the downlink amplification path of the repeater is activated, an activated throughput value for data received at the UE in a selected time period can be identified by the repeater. The repeater can be configured to determine a difference between the deactivated throughput value and the activated throughput value. When the deactivated throughput value is greater than the activated throughput value by a selected threshold value, a repeater gain level of a downlink amplification path of the repeater can be reduced.

The downlink amplification path of the repeater can be deactivated by one or more of: reducing a gain of one or more amplifiers in the downlink amplification path; increasing an attenuation in the downlink amplification path; or turning off one or more amplifiers in the downlink amplification path.

The downlink amplification path of the repeater can be activated by one or more of: increasing a gain of one or more amplifiers in the downlink amplification path; decreasing an attenuation in the downlink amplification path; or turning on one or more amplifiers in the downlink amplification path.

The uplink amplification path of the repeater can be deactivated by one or more of: reducing a gain of one or more amplifiers in the uplink amplification path; increasing an attenuation in the uplink amplification path; or turning off one or more amplifiers in the uplink amplification path.

The uplink amplification path of the repeater can be activated by one or more of: increasing a gain of one or more amplifiers in the uplink amplification path; decreasing an attenuation in the uplink amplification path; or turning on one or more amplifiers in the uplink amplification path.

In another example, an application (app) configured to operate at a UE can be configured to allow the UE and repeater to communicate information. For example, the app can be configured to: (1) receive a downlink signal strength indicator (DSSI) value request from the repeater and send the DSSI value to the repeater in response, (2) send the DSSI to the repeater periodically without a DSSI value request, (3) send the DSSI value to the repeater when a change in DSSI value occurs, or (4) synchronize a clock at the UE with a clock operating at the repeater and send the DSSI information from the UE to the repeater at predetermined time periods, such as at known time periods when the repeater is on (i.e. the downlink amplification path and/or uplink amplification path are activated) and at known time periods when the repeater is off (i.e. the uplink amplification path and/or downlink amplification path are not activated).

In another example, relatively strong (i.e. high amplitude) downlink signals can be received at a repeater when the repeater is located near a base station. When a UE receives the relatively strong downlink signal, the UE infers that it is near the base station. In order to save power, the UE transmits a relatively low power uplink signal back to the base station. Accordingly, when the repeater receives a strong downlink signal from the base station and the repeater receives a weak uplink signal from the UE (thereby implying that the UE is near the server antenna of the repeater), then the repeater may not be needed by the UE. The downlink signal received at the repeater can be measured by the downlink signal strength indicator, such as a received signal strength indicator measurement that is made at the repeater. The uplink signal received at the repeater can be measured by the uplink received power at the repeater. A relatively strong downlink signal from the base station, wherein the relatively strong downlink signal from the base station can be measured by the downlink signal strength indicator, can be a downlink signal that exceeds a threshold. A relatively weak uplink signal from the UE, wherein the uplink signal from the UE can be measured by the uplink received power at the repeater, can be an uplink signal that is less than a threshold. When the uplink signal is less than a threshold, the repeater may not be needed. In this example, the repeater can be turned off when the repeater is not needed. When the repeater is not needed, the repeater gain level can be reduced by reducing the gain of one or more amplifiers in the uplink amplification path; increasing an attenuation in the uplink amplification path; or turning off one or more amplifiers in the uplink amplification path. When the uplink signal from the UE, which can be measured by the uplink received power at the repeater, is greater than a threshold, then the repeater may be needed. In this example, when the repeater is needed, the repeater can be turned on. In another example, when the repeater is needed, the repeater gain level can be increased by: increasing the gain of one or more amplifiers in the uplink amplification path, decreasing an attenuation in the uplink amplification path; or turning on one or more amplifiers in the uplink amplification path.

In one example, the threshold for the downlink signal strength indicator can be greater than a range from −40 decibel-milliwatts (dBm) RSSI (which is decibels with respect to one milliwatt of power) to −60 dBm RSSI. In another example, the threshold for the uplink RSSI at the repeater can vary depending on the proximity between the UE and the repeater's server antenna. When the UE is in a cradle that includes a server antenna, then the uplink threshold can be less than a range from 0 dBm RSSI to −20 dBm RSSI. When the uplink signal from the UE is below that range, the repeater may not be needed. When the uplink signal from the UE is above that range, the repeater may be needed. In another example, a repeater may be configured to work in a car, a room, a building, or may be located outside. The UE in the car, room, building, or outside may be a certain distance from a server antenna of the repeater. When the UE is farther from the server antenna of the repeater, then the uplink threshold can be less than a range from −10 dBm RSSI to −60 dBm RSSI. When the uplink signal from the UE is below that range, the repeater may not be needed. When the uplink signal from the UE is above that range, the repeater may be needed.

In another example, the uplink signal strength indicator value received at the repeater via a wireless connection with the UE can be used to estimate the distance between the UE and the server antenna of the repeater. In another example, the uplink signal strength indicator value can be measured at the repeater and can be used to estimate the distance between the UE and the server antenna of the repeater. A UE's maximum transmit power on LTE can typically be roughly 19 dBm, and a UE's maximum transmit power for code division multiple access (CDMA) can typically be roughly 23 dBm. When the repeater receives an uplink signal with a power that is greater than 10 dBm, then the UE may be located relatively close in proximity to the server antenna of the repeater. A UE may not transmit at maximum power because the UE can preserve battery life by transmitting at less than maximum power. Typically, a UE may transmit an uplink signal at a maximum power when a relatively weak downlink signal is received. When a UE transmits at maximum power, then the booster may be needed because the UE may be in a weak downlink signal area. A distance between the UE and a repeater's server antenna can be estimated based on the uplink transmit power.

In one example, the maximum power of the uplink transmit power of the UE can be 23 dBm in the case of LTE. The free space path loss for a distance of five feet at 700 MHz can be 33.0 dB. Therefore, if a UE is transmitting an uplink transmit power of 23 dBm at a distance of five feet away from the server antenna of the repeater, then the repeater can measure an uplink transmit power of −10 dBm, assuming a 0 decibels relative to isotropic (dBi) and no coax loss. In another example, the free space path loss for a distance of two feet at 700 MHz can be 25.0 dB.

In another example, the uplink signal strength indicator value can be one or more of: a received signal strength indicator (RSSI), measured at the UE or the repeater; a signal to noise ratio (SNR) measured at the UE or the repeater; a reference signal received power (RSRP), measured at the UE or the repeater; a reference signal received quality (RSRQ), measured at the UE or the repeater; a received signal code power (RSCP), measured at the UE or the repeater; an arbitrary strength unit (ASU), measured at the UE or the repeater; or a channel quality indicator (CQI), measured at the UE or the repeater.

In another example, a band (e.g., LTE frequency bands 2, 4, 5, 12, 13, 14, 17, 25, 26, 71, or any of bands 1-85) can include a plurality of channels. The bands can be FDD bands or TDD bands. For bands that are designated as FDD, the plurality of channels can be uplink channels or downlink channels. A client UE, i.e., the UE associated with the repeater, can use one or more of the channels. In another example, the detection path may not be channelized. In this example, the UL signal can be correlated with the DL signal. When the UE receives a relatively strong DL signal, the UE can infer that it is located near the base station and can transmit a relatively low power UL signal. As previously discussed, the repeater can detect the DL signal power as well. A strong DL signal measured at the repeater can also infer that the repeater is near the base station. However, it is possible that the strong DL signal is received from one or more channels that are not used by the client UE. To verify whether the strong DL signal is due to one or more channels used by the client UE, the UL received signal can also be measured. If the UE is transmitting at a relatively low power, and the downlink power is relatively strong, then it can be inferred that the repeater is located near the base station, and amplification of the UE client signal by the repeater may not be needed. However, if the downlink signal at the repeater is relatively strong and the uplink signal from the client UE is also relatively strong, then it can be inferred that the strong downlink signal may be due to other channels within the band. Accordingly, the amplification of the client UE signal by the repeater may still be needed.

In another example, the detection path can be channelized. In this example, the UL signal channel can be correlated with the DL signal channel. Without channelization, it can be unclear whether the repeater is needed. With channelization, the repeater can determine that the relatively weak UL signal is below the threshold and that the relatively weak UL signal is coming from a client UE and not a different UE. This relatively weak UL signal from the client UE can be correlated with one or more channels used by the client UE of relatively strong DL signal. Correlating the relatively weak UL signal from the UE with the relatively strong DL signal, by identifying the channels within the bands that are used by the client UE, can increase the probability of correctly determining that amplification by the repeater is needed or not needed.

In another example, a repeater can be configured to measure, at the repeater, an uplink signal strength indicator value of a selected channel of a selected band of a user equipment (U E) received at the repeater. In another example, a repeater can be configured to identify a threshold value for the uplink signal strength indicator value. In another example, a repeater can be configured to receive a downlink signal strength indicator value of the selected channel of the selected band of the UE received at the repeater. In another example, a repeater can be configured to identify a threshold value for the downlink signal strength indicator value.

In another example, a repeater can be configured to identify that the downlink signal strength indicator value for the selected channel of the selected band is greater than the threshold value for the downlink signal strength indicator value. In another example, a repeater can be configured to identify that the uplink signal strength indicator value for the selected channel of the selected band is greater than the threshold value for the uplink signal strength indicator value. In another example, a repeater can be configured to determine that the downlink signal strength indicator value is caused by channels within the selected band that are not used by the UE.

In another example, the selected band can be one or more of LTE frequency bands 2, 4, 5, 12, 13, 17, 25, 26, and 71. In another example, the selected band can be one or more of LTE frequency bands 1 through 85.

In another example, a repeater can be configured to maintain or activate one or more of: the downlink repeater gain level or the uplink repeater gain level. The downlink repeater gain level can be maintained or activated when the downlink signal strength indicator value is greater than the threshold value for the downlink signal strength indicator value. The uplink repeater gain level can be maintained or activated when the uplink signal strength indicator value is greater than the threshold value for the uplink signal strength indicator value.

In another example, the uplink signal strength indicator value can be one or more of: a received signal strength indicator (RSSI), measured at the UE or the repeater; a signal to noise ratio (SNR) measured at the UE or the repeater; a reference signal received power (RSRP), measured at the UE or the repeater; a reference signal received quality (RSRQ), measured at the UE or the repeater; a received signal code power (RSCP), measured at the UE or the repeater; an arbitrary strength unit (ASU), measured at the UE or the repeater; or a channel quality indicator (CQI), measured at the UE or the repeater.

In another example, the downlink signal strength indicator value can be one or more of: a received signal strength indicator (RSSI), measured at the repeater or the UE; a signal to noise ratio (SNR), measured at the repeater or the UE; a reference signal received power (RSRP), measured at the repeater or the UE; a reference signal received quality (RSRQ), measured at the repeater or the UE; a received signal code power (RSCP), measured at the repeater or the UE; an arbitrary strength unit (ASU), measured at the repeater or the UE; or a channel quality indicator (CQI), measured at the repeater or the UE.

In another example, a repeater can be configured to adjust a repeater gain level. The repeater gain level can be adjusted by: adjusting a gain of one or more amplifiers in one or more of a downlink amplification path or an uplink amplification path of the repeater; adjusting an attenuation in one or more of the downlink amplification path or the uplink amplification path of the repeater; or enabling, bypassing, or disabling one or more of the downlink amplification path or the uplink amplification path of the repeater.

In another example, channelized detection can include down-conversion and analog or digital detection. In another example, channelized detection for the DL channel can be performed using a modem. In another example, channelized detection in the DL signal or UL signal can be detected by converting the signal to an intermediate frequency (IF). In another example, the IF signal can be digitized and analyzed.

Figure 6:
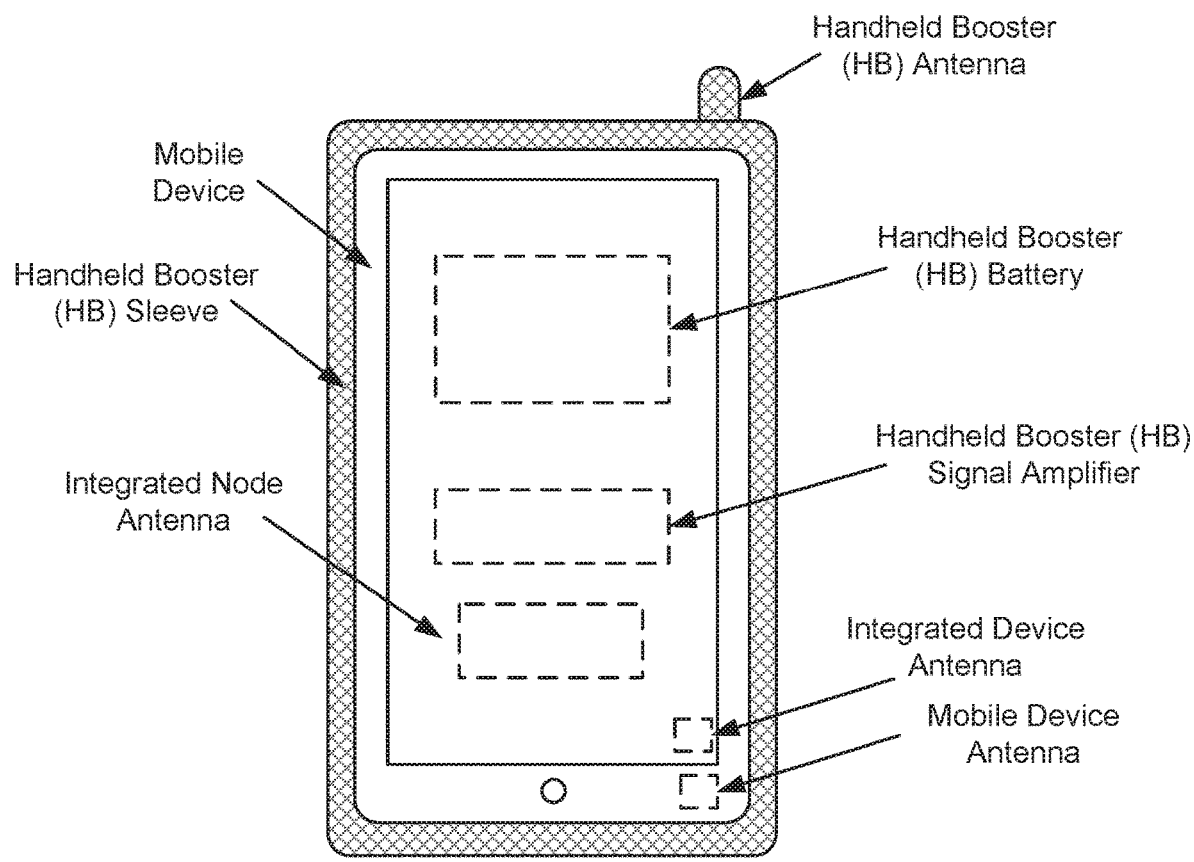
FIG. 6 illustrates a handheld booster in communication with a wireless device in accordance with an example.

While various embodiments described herein, and illustrated in FIGS. 1-5*b*, have been described with respect to a cellular signal amplifier with a donor antenna and a server antenna, this is not intended to be limiting. Booster gain adjustment based on UE need can also be accomplished using a handheld booster, as illustrated in FIG. 6. The handheld booster can include an integrated device antenna and the integrated node antenna that are typically used in place of the indoor antenna and outdoor antenna, respectively.

Figure 7:
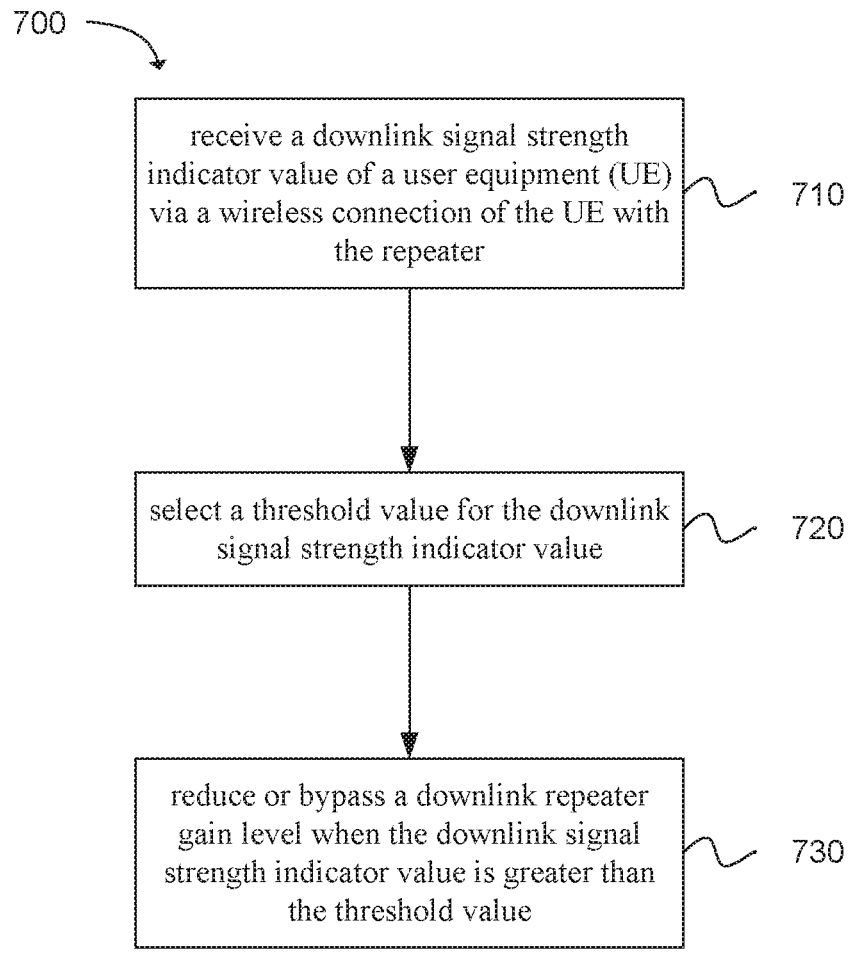
FIG. 7 depicts functionality of a repeater operable to adjust gain based on user equipment need in accordance with an example.

Another example provides functionality 700 of a repeater for adjusting gain based on user equipment need, as shown in the flow chart in FIG. 7. The repeater can be configured to receive a downlink signal strength indicator value of a user equipment (UE) via a wireless connection of the UE with the repeater, as shown in block 710. The repeater can be further configured to select a threshold value for the downlink signal strength indicator value, as shown in block 720. The repeater can be further configured to reduce or bypass a downlink repeater gain level when the downlink signal strength indicator value is greater than the threshold value, as shown in block 730.

Figure 8:
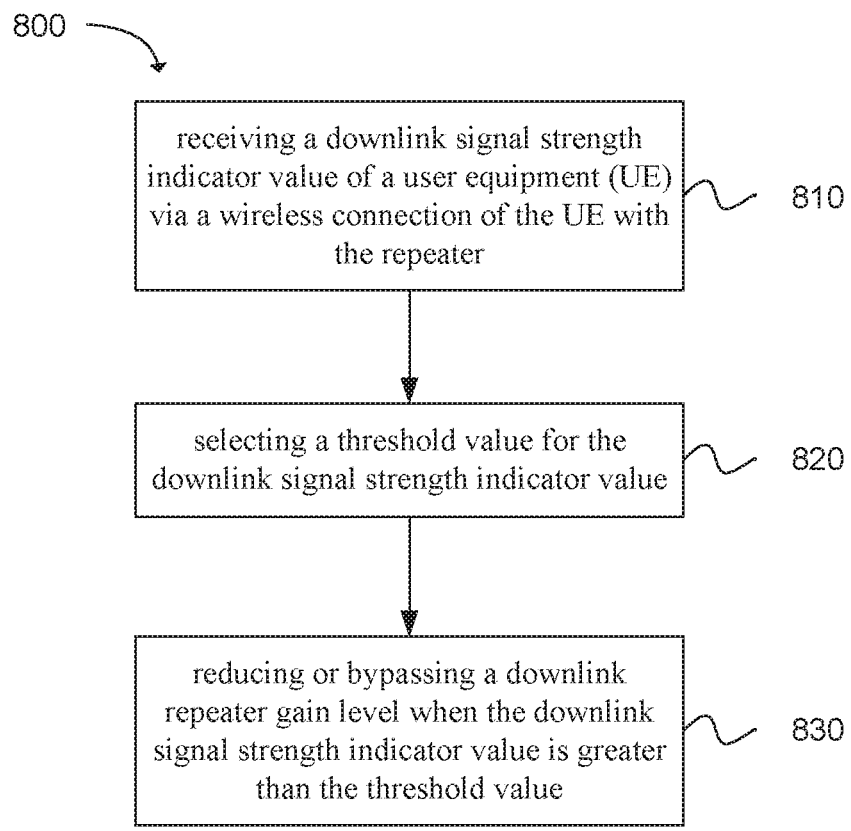
FIG. 8 depicts a flow chart of a machine readable medium having instructions embodied thereon for adjusting gain based on user equipment need in accordance with an example.

Another example provides at least one machine readable storage medium having instructions 800 embodied thereon for adjusting gain based on user equipment need, as shown in FIG. 8. The instructions can be executed on a machine, where the instructions are included on at least one computer readable medium or one non-transitory machine readable storage medium. The instructions when executed perform: receiving a downlink signal strength indicator value of a user equipment (UE) via a wireless connection of the UE with the repeater, as shown in block 810. The instructions when executed perform: selecting a threshold value for the downlink signal strength indicator value, as shown in block 820. The instructions when executed perform: reducing or bypassing a downlink repeater gain level when the downlink signal strength indicator value is greater than the threshold value, as shown in block 830.

Figure 9:
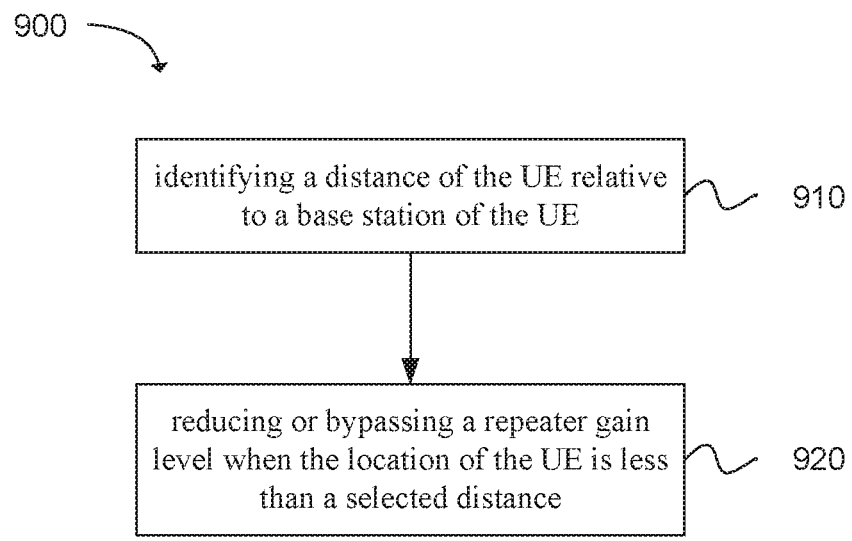
FIG. 9 depicts a flow chart of a machine readable medium having instructions embodied thereon for adjusting gain based on user equipment need in accordance with an example.

Another example provides at least one machine readable storage medium having instructions 900 embodied thereon for adjusting gain based on user equipment need, as shown in FIG. 9. The instructions can be executed on a machine, where the instructions are included on at least one computer readable medium or one non-transitory machine readable storage medium. The instructions when executed perform: identifying a distance of the UE relative to a base station of the UE, as shown in block 910. The instructions when executed perform: reducing or bypassing a repeater gain level when the location of the UE is less than a selected distance, as shown in block 920.

Figure 10:
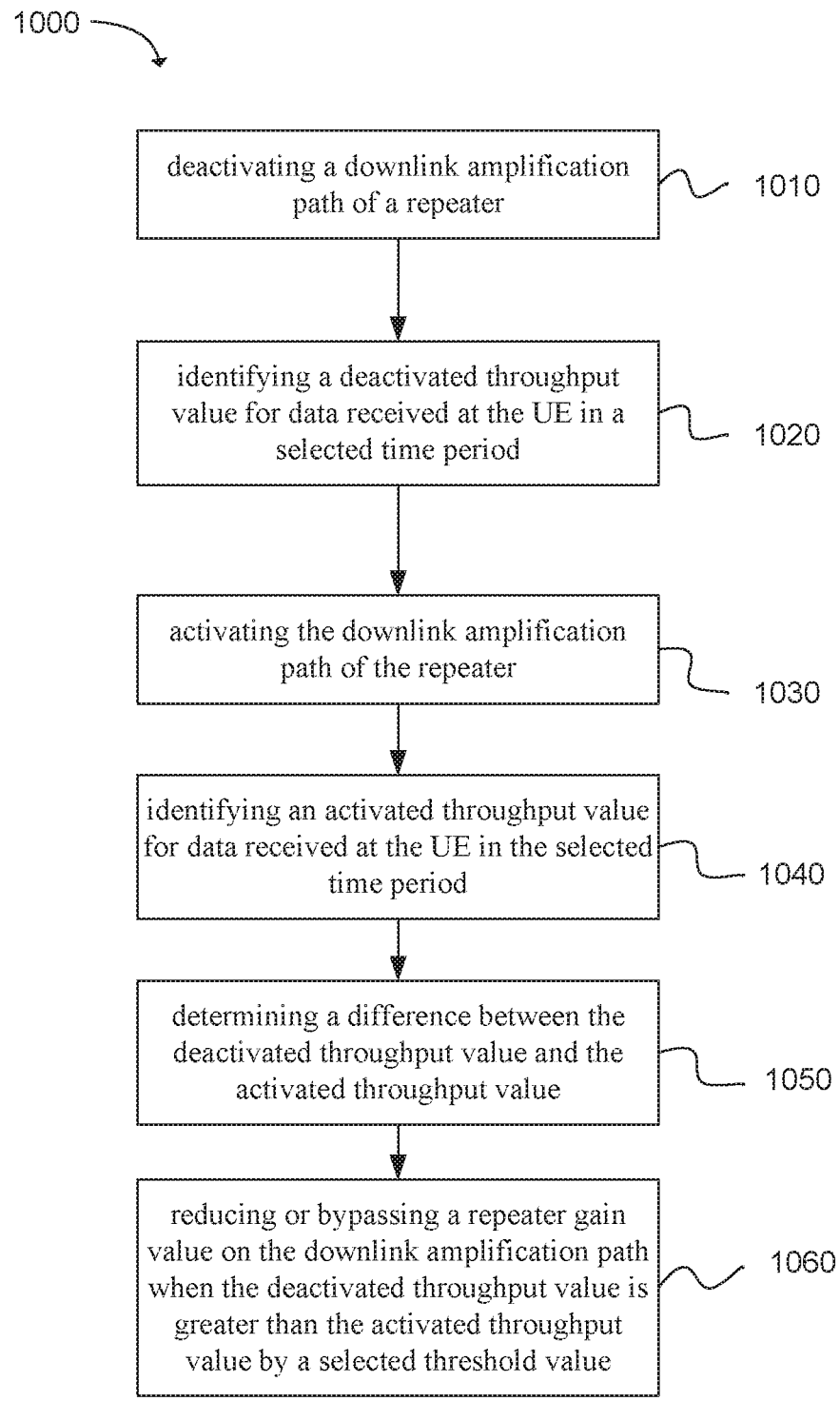
FIG. 10 depicts a flow chart of a machine readable medium having instructions embodied thereon for adjusting gain based on user equipment need in accordance with an example.

Another example provides at least one machine readable storage medium having instructions 1000 embodied thereon for adjusting gain based on user equipment need, as shown in FIG. 10. The instructions can be executed on a machine, where the instructions are included on at least one computer readable medium or one non-transitory machine readable storage medium. The instructions when executed perform: deactivating a downlink amplification path of a repeater, as shown in block 1010. The instructions when executed perform: identifying a deactivated throughput value for data received at the UE in a selected time period, as shown in block 1020. The instructions when executed perform: activating the downlink amplification path of the repeater, as shown in block 1030. The instructions when executed perform: identifying an activated throughput value for data received at the UE in the selected time period, as shown in block 1040. The instructions when executed perform: determining a difference between the deactivated throughput value and the activated throughput value, as shown in block 1050. The instructions when executed perform: reducing or bypassing a repeater gain value on the downlink amplification path when the deactivated throughput value is greater than the activated throughput value by a selected threshold value, as shown in block 1060.

Figure 11:
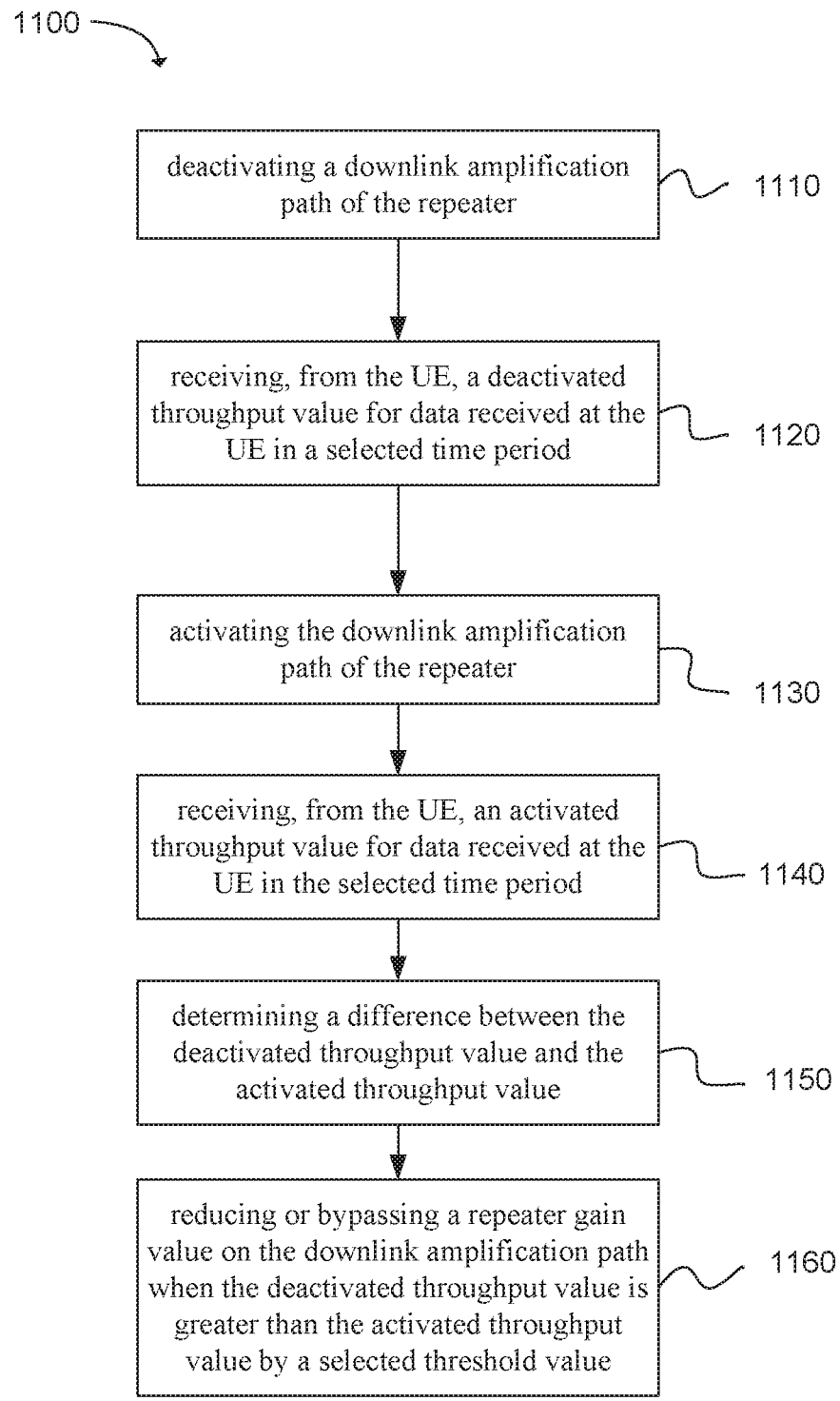
FIG. 11 depicts a flow chart of a machine readable medium having instructions embodied thereon for adjusting repeater gain based on user equipment need in accordance with an example.

Another example provides at least one machine readable storage medium having instructions embodied thereon for adjusting repeater gain based on UE need, as shown in FIG. 11. The instructions can be executed on a machine, where the instructions are included on at least one computer readable medium or one non-transitory machine readable storage medium. The instructions when executed perform: deactivating a downlink amplification path of the repeater, as shown in block 1110. The instructions when executed perform: receiving, from the UE, a deactivated throughput value for data received at the UE in a selected time period, as shown in block 1120. The instructions when executed perform: activating the downlink amplification path of the repeater, as shown in block 1130. The instructions when executed perform: receiving, from the UE, an activated throughput value for data received at the UE in the selected time period, as shown in block 1140. The instructions when executed perform: determining a difference between the deactivated throughput value and the activated throughput value, as shown in block 1150. The instructions when executed perform: reducing or bypassing a repeater gain value on the downlink amplification path when the deactivated throughput value is greater than the activated throughput value by a selected threshold value, as in block 1160.

Figure 12:
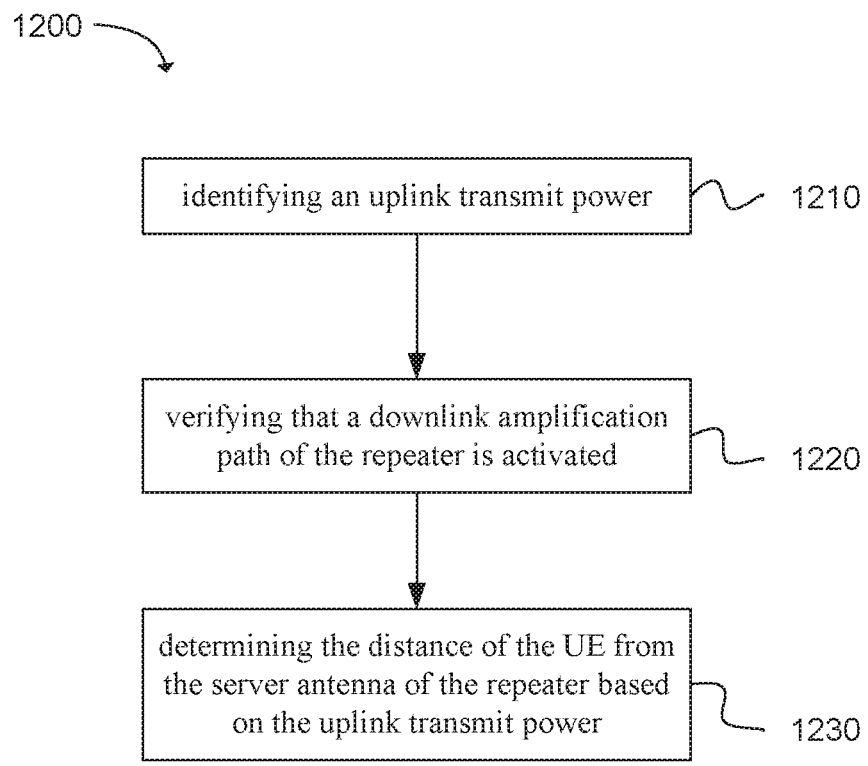
FIG. 12 depicts a flow chart of a machine readable medium having instructions embodied thereon for adjusting repeater gain based on user equipment need in accordance with an example.

Another example provides at least one machine readable storage medium having instructions 1200 embodied thereon for adjusting repeater gain based on user equipment (UE) need, as shown in FIG. 12. The instructions can be executed on a machine, where the instructions are included on at least one computer readable medium or one non-transitory machine readable storage medium. The instructions when executed perform: determining a distance of the UE from a server antenna of a repeater, comprising: identifying an uplink transmit power, as shown in block 1210, verifying that a downlink amplification path of the repeater is activated, as shown in block 1220; and determining the distance of the UE from the server antenna of the repeater based on the uplink transmit power, as shown in block 1230.

Figure 13:
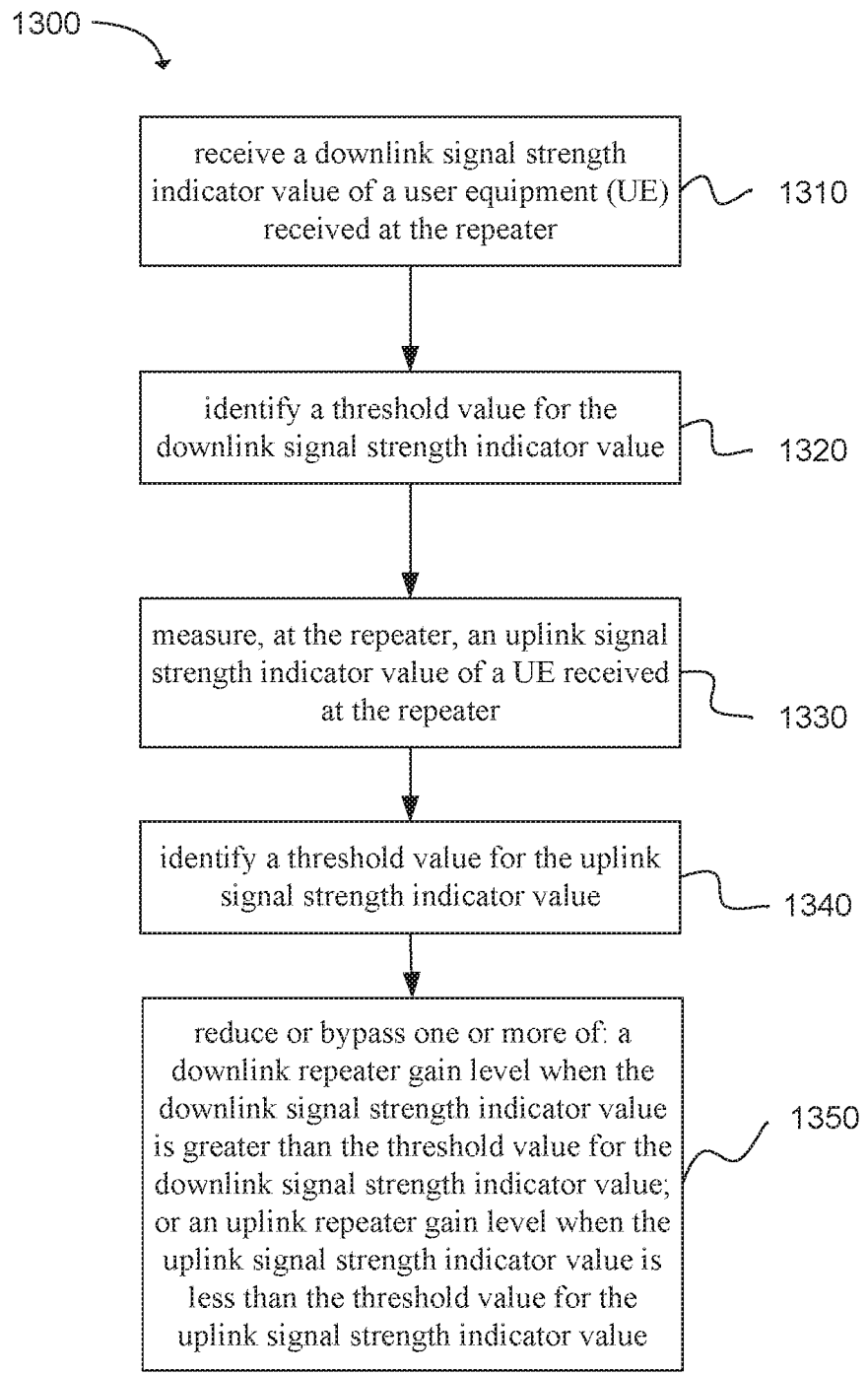
FIG. 13 depicts functionality of a repeater operable to adjust gain based on user equipment need in accordance with an example.

Another example provides functionality 1300 of a repeater operable to adjust gain based on user equipment need, as shown in the flow chart in FIG. 13. The repeater can be configured to receive a downlink signal strength indicator value of a user equipment (UE) received at the repeater, as shown in block 1310. The repeater can be further configured to identify a threshold value for the downlink signal strength indicator value, as shown in block 1320. The repeater can be further configured to measure, at the repeater, an uplink signal strength indicator value of a UE received at the repeater, as shown in block 1330. The repeater can be further configured to identify a threshold value for the uplink signal strength indicator value, as shown in block 1340. The repeater can be further configured to reduce or bypass one or more of: a downlink repeater gain level when the downlink signal strength indicator value is greater than the threshold value for the downlink signal strength indicator value; or an uplink repeater gain level when the uplink signal strength indicator value is less than the threshold value for the uplink signal strength indicator value, as shown in block 1350.

Figure 14:
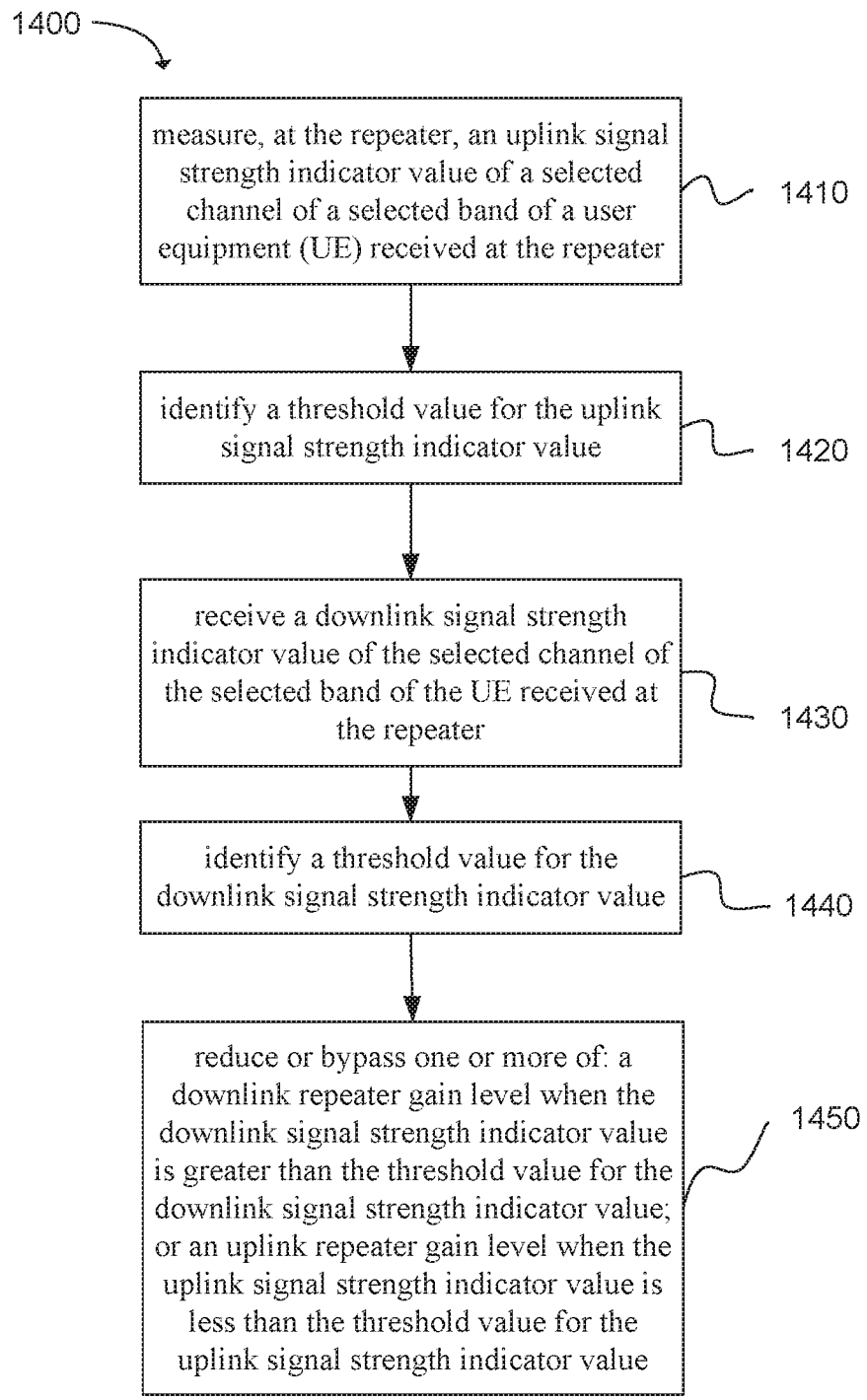
FIG. 14 depicts functionality of a repeater operable to adjust gain based on user equipment need in accordance with an example.

Another example provides functionality 1400 of a repeater operable to adjust gain based on user equipment need, as shown in FIG. 14. The repeater can be configured to measure, at the repeater, an uplink signal strength indicator value of a selected channel of a selected band of a user equipment (UE) received at the repeater, as shown in block 1410. The repeater can be further configured to identify a threshold value for the uplink signal strength indicator value, as shown in block 1420. The repeater can be further configured to receive a downlink signal strength indicator value of the selected channel of the selected band of the UE received at the repeater, as shown in block 1430. The repeater can be further configured to identify a threshold value for the downlink signal strength indicator value, as shown in block 1440. The repeater can be further configured to reduce or bypass one or more of: a downlink repeater gain level when the downlink signal strength indicator value is greater than the threshold value for the downlink signal strength indicator value; or an uplink repeater gain level when the uplink signal strength indicator value is less than the threshold value for the uplink signal strength indicator value, as shown in block 1450.

EXAMPLES

The following examples pertain to specific technology embodiments and point out specific features, elements, or actions that can be used or otherwise combined in achieving such embodiments.

Example 1 includes a repeater operable to adjust gain based on user equipment need, the repeater configured to: measure, at the repeater, an uplink signal strength indicator value of a selected channel of a selected band of a user equipment (UE) received at the repeater; identify a threshold value for the uplink signal strength indicator value; receive a downlink signal strength indicator value of the selected channel of the selected band of the UE received at the repeater; identify a threshold value for the downlink signal strength indicator value; and reduce or bypass one or more of: a downlink repeater gain level when the downlink signal strength indicator value is greater than the threshold value for the downlink signal strength indicator value; or an uplink repeater gain level when the uplink signal strength indicator value is less than the threshold value for the uplink signal strength indicator value.

Example 2 includes the repeater of Example 1, further configured to: identify the downlink signal strength indicator value for the selected channel of the selected band is greater than the threshold value for the downlink signal strength indicator value; identify the uplink signal strength indicator value for the selected channel of the selected band is greater than the threshold value for the uplink signal strength indicator value; determine that the downlink signal strength indicator value is caused by channels within the selected band that are not used by the UE; maintain or activate one or more of: the downlink repeater gain level when the downlink signal strength indicator value is greater than the threshold value for the downlink signal strength indicator value; and the uplink repeater gain level when the uplink signal strength indicator value is greater than the threshold value for the uplink signal strength indicator value.

Example 3 includes the repeater of Example 1, wherein the repeater is further configured to adjust a repeater gain level.

Example 4 includes the repeater of Example 3, wherein the repeater is further configured to adjust the repeater gain level by one or more of: adjusting a gain of one or more amplifiers in one or more of a downlink amplification path or an uplink amplification path of the repeater; adjusting an attenuation in one or more of the downlink amplification path or the uplink amplification path of the repeater; or enabling, bypassing, or disabling one or more of the downlink amplification path or the uplink amplification path of the repeater.

Example 5 includes the repeater of Example 1, wherein the downlink signal strength indicator is one or more of: a received signal strength indicator (RSSI), received at the repeater; a signal to noise ratio (SNR), received at the repeater; a reference signal received power (RSRP), received at the repeater; a reference signal received quality (RSRQ), received at the repeater; a received signal code power (RSCP), received at the repeater; an arbitrary strength unit (ASU), received at the repeater; or a channel quality indicator (CQI), received at the repeater.

Example 6 includes the repeater of Example 1, wherein the uplink signal strength indicator is one or more of: a received signal strength indicator (RSSI), measured at the repeater; a signal to noise ratio (SNR), measured at the repeater; a reference signal received power (RSRP), measured at the repeater; a reference signal received quality (RSRQ), measured at the repeater; a received signal code power (RSCP), measured at the repeater; an arbitrary strength unit (ASU), measured at the repeater; or a channel quality indicator (CQI), measured at the repeater.

Example 7 includes the repeater of Example 1, wherein the selected band is long term evolution (LTE) frequency band 2, 4, 5, 12, 13, 17, 25, 26, or 71.

Example 8 includes the repeater of Example 1, wherein the selected band is one or more of long term evolution (LTE) frequency bands 1-53, 65-76, 85, 87, or 88, or fifth generation (5G) frequency bands n1-3, n5, n7, n8, n12, n14, n18, n20, n25, n28-30, n34, n38-41, n 48, n50, n51, n65, n66, n70, n71, n74-84, n86, n89, n90, n257, n258, n260, n261.

Example 9 includes a repeater operable to adjust gain based on user equipment need, the repeater configured to: receive a downlink signal strength indicator value of a user equipment (UE) via a wireless connection of the UE with the repeater; select a threshold value for the downlink signal strength indicator value; and reduce or bypass a downlink repeater gain level when the downlink signal strength indicator value is greater than the threshold value.

Example 10 includes the repeater of Example 9, wherein the wireless connection includes one or more of a wireless personal area network (W-PAN) or a wireless local area network (W-LAN).

Example 11 includes the repeater of Example 9, wherein the repeater is further configured to adjust a repeater gain level.

Example 12 includes the repeater of Example 11, wherein the repeater is further configured to adjust the repeater gain level by one or more of: adjusting a gain of one or more amplifiers in one or more of a downlink amplification path or an uplink amplification path of the repeater; adjusting an attenuation in one or more of the downlink amplification path or the uplink amplification path of the repeater; or enabling, bypassing, or disabling one or more of the downlink amplification path or the uplink amplification path of the repeater.

Example 13 includes the repeater of Example 9, wherein the downlink signal strength indicator is one or more of: a received signal strength indicator (RSSI), measured at the UE; a signal to noise ratio (SNR), measured at the UE; a reference signal received power (RSRP), measured at the UE; a reference signal received quality (RSRQ), measured at the UE; a received signal code power (RSCP), measured at the UE; an arbitrary strength unit (ASU), measured at the UE; or a channel quality indicator (CQI), measured at the UE.

Example 14 includes at least one machine readable storage medium having instructions embodied thereon for adjusting gain based on user equipment need, the instructions when executed by one or more processors at a repeater perform the following: receiving a downlink signal strength indicator value of a user equipment (UE) via a wireless connection of the UE with the repeater; selecting a threshold value for the downlink signal strength indicator value; and reducing or bypassing a downlink repeater gain level when the downlink signal strength indicator value is greater than the threshold value.

Example 15 includes the at least one machine readable storage medium of Example 14, wherein the wireless connection includes one or more of a wireless personal area network (W-PAN) or a wireless local area network (W-LAN).

Example 16 includes the at least one machine readable storage medium of Example 14, further comprising instructions that, when executed, perform the following: adjusting a repeater gain level.

Example 17 includes the at least one machine readable storage medium of Example 16, further comprising instructions that, when executed, perform the following: adjusting the repeater gain level by one or more of: adjusting a gain of to one or more amplifiers in one or more of a downlink amplification path or an uplink amplification path of the repeater; adjusting an attenuation in one or more of the downlink amplification path or the uplink amplification path of the repeater; or enabling, bypassing, or disabling one or more of the downlink amplification path or the uplink amplification path of the repeater.

Example 18 includes the at least one machine readable storage medium of Example 14, wherein the downlink signal strength indicator is one or more of: a received signal strength indicator (RSSI), measured at the UE; a signal to noise ratio (SNR), measured at the UE; a reference signal received power (RSRP), measured at the UE; a reference signal received quality (RSRQ), measured at the UE; a received signal code power (RSCP), measured at the UE; an arbitrary strength unit (ASU), measured at the UE; or a channel quality indicator (CQI), measured at the UE.

Example 19 includes at least one machine readable storage medium having instructions embodied thereon for adjusting repeater gain based on UE need, the instructions when executed by one or more processors at a user equipment (UE) perform the following: identifying a distance of the UE relative to a base station of the UE; and reducing or bypassing a repeater gain level when the location of the UE is less than a selected distance.

Example 20 includes the at least one machine readable storage medium of Example 19, further comprising instructions that, when executed, perform the following: identifying the distance of the UE, comprising: determine a location of the UE using a location-based service at the UE; and determine the distance of the UE based on the UE location relative to the base station; adjusting the repeater gain level based on the distance of the UE relative to the base station.

Example 21 includes the at least one machine readable storage medium of Example 20, further comprising instructions that, when executed, perform the following: determine the location of the UE using the location-based service, wherein the location-based service includes one or more of: a satellite location system receiver; a cellular location-based service; or a radio frequency triangulation device.

Example 22 includes the at least one machine readable storage medium of Example 19, further comprising instructions that, when executed, perform the following: reducing the repeater gain level by one or more of: reducing a gain of one or more amplifiers in an uplink amplification path; increasing an attenuation in an uplink amplification path; turning off one or more amplifiers in an uplink amplification path; reducing a gain of one or more amplifiers in a downlink amplification path; increasing an attenuation in a downlink amplification path; or turning off one or more amplifiers in a downlink amplification path.

Example 23 includes at least one machine readable storage medium having instructions embodied thereon for adjusting repeater gain based on UE need, the instructions when executed by one or more processors at a user equipment (UE) perform the following: deactivating a downlink amplification path of a repeater; identifying a deactivated throughput value for data received at the UE in a selected time period; activating the downlink amplification path of the repeater; identifying an activated throughput value for data received at the UE in the selected time period; determining a difference between the deactivated throughput value and the activated throughput value; and reducing or bypassing a repeater gain value on the downlink amplification path when the deactivated throughput value is greater than the activated throughput value by a selected threshold value.

Example 24 includes the at least one machine readable storage medium of Example 23, further comprising instructions that, when executed, perform the following: deactivating the downlink amplification path of the repeater by: sending instructions to the repeater to instruct the repeater to: reduce a gain of one or more amplifiers in the downlink amplification path; increase an attenuation in the downlink amplification path; or turn off one or more amplifiers in the downlink amplification path.

Example 25 includes the at least one machine readable storage medium of Example 23, further comprising instructions that, when executed, perform the following: activating the downlink amplification path of the repeater by: sending instructions to the repeater to instruct the repeater to: increase a gain of one or more amplifiers in the downlink amplification path; reduce an attenuation in the downlink amplification path; or turn on one or more amplifiers in the downlink amplification path.

Example 26 includes the at least one machine readable storage medium of Example 23, further comprising instructions that, when executed, perform the following: deactivating an uplink amplification path of the repeater by: sending instructions to the repeater to instruct the repeater to: reduce a gain of one or more amplifiers in the uplink amplification path; increase an attenuation in the uplink amplification path; or turn off one or more amplifiers in the uplink amplification path.

Example 27 includes the at least one machine readable storage medium of Example 23, further comprising instructions that, when executed, perform the following: activating an uplink amplification path of the repeater by: sending instructions to the repeater to instruct the repeater to: increase a gain of one or more amplifiers in the uplink amplification path; reduce an attenuation in the uplink amplification path; or turn on one or more amplifiers in the uplink amplification path.

Example 28 includes at least one machine readable storage medium having instructions embodied thereon for adjusting repeater gain based on UE need, the instructions when executed by one or more processors at a repeater perform the following: deactivating a downlink amplification path of the repeater; receiving, from the UE, a deactivated throughput value for data received at the UE in a selected time period; activating the downlink amplification path of the repeater; receiving, from the UE, an activated throughput value for data received at the UE in the selected time period; determining a difference between the deactivated throughput value and the activated throughput value; and reducing or bypassing a repeater gain value on the downlink amplification path when the deactivated throughput value is greater than the activated throughput value by a selected threshold value.

Example 29 includes the at least one machine readable storage medium of Example 28, further comprising instructions that, when executed, perform the following: deactivating the downlink amplification path of the repeater by: reducing a gain of one or more amplifiers in the downlink amplification path; increasing an attenuation in the downlink amplification path; or turning off one or more amplifiers in the downlink amplification path.

Example 30 includes the at least one machine readable storage medium of Example 28, further comprising instructions that, when executed, perform the following: activating the downlink amplification path of the repeater by: increasing a gain of one or more amplifiers in the downlink amplification path; reducing an attenuation in the downlink amplification path; or turning on one or more amplifiers in the downlink amplification path.

Example 31 includes the at least one machine readable storage medium of Example 28, further comprising instructions that, when executed, perform the following: deactivating an uplink amplification path of the repeater by: reducing a gain of one or more amplifiers in the uplink amplification path; increasing an attenuation in the uplink amplification path; or turning off one or more amplifiers in the uplink amplification path.

Example 32 includes the at least one machine readable storage medium of Example 28, further comprising instructions that, when executed, perform the following: activating an uplink amplification path of the repeater by: increasing a gain of one or more amplifiers in the uplink amplification path; reducing an attenuation in the uplink amplification path; or turning on one or more amplifiers in the uplink amplification path.

Example 33 includes at least one machine readable storage medium having instructions embodied thereon for adjusting repeater gain based on user equipment (UE) need, the instructions when executed by one or more processors at a repeater perform the following: determining a distance of the UE from a server antenna of a repeater, comprising: identifying an uplink transmit power; verifying that a downlink amplification path of the repeater is activated; and determining the distance of the UE from the server antenna of the repeater based on the uplink transmit power.

Example 34 includes the at least one machine readable storage medium to of Example 33, further comprising instructions that, when executed, perform the following: reducing or bypassing a repeater gain level when the distance of the UE from the server antenna of the repeater is less than a selected distance.

Example 35 includes the at least one machine readable storage medium of Example 33, further comprising instructions that, when executed, perform the following: determining a distance of the UE from a server antenna of a repeater, comprising: receiving an uplink transmit power at the UE via a wireless connection of the UE with the repeater.

Example 36 includes a repeater operable to adjust gain based on user equipment need, the repeater configured to: receive a downlink signal strength indicator value of a user equipment (UE) received at the repeater; identify a threshold value for the downlink signal strength indicator value; measure, at the repeater, an uplink signal strength indicator value of a UE received at the repeater; identify a threshold value for the uplink signal strength indicator value; and reduce or bypass one or more of: a downlink repeater gain level when the downlink signal strength indicator value is greater than the threshold value for the downlink signal strength indicator value; or an uplink repeater gain level when the uplink signal strength indicator value is less than the threshold value for the uplink signal strength indicator value.

Example 37 includes the repeater of Example 36, further configured to: identify the downlink signal strength indicator value for the selected band is greater than the threshold value for the downlink signal strength indicator value; identify the uplink signal strength indicator value for the selected band is greater than the threshold value for the uplink signal strength indicator value; determine that the downlink signal strength indicator value is caused by channels within the selected band that are not used by the UE; maintain or activate one or more of: the downlink repeater gain level when the downlink signal strength indicator value is greater than the threshold value for the downlink signal strength indicator value; and the uplink repeater gain level when the uplink signal strength indicator value is greater than the threshold value for the uplink signal strength indicator value.

Example 38 includes a repeater operable to adjust gain based on user equipment need, the repeater configured to: receive a downlink signal strength indicator value of a user equipment (UE) received at the repeater; identify a threshold value for the downlink signal strength indicator value; measure, at the repeater, an uplink signal strength indicator value of a UE received at the repeater; identify a threshold value for the uplink signal strength indicator value; and reduce or bypass one or more of: a downlink repeater gain level when the downlink signal strength indicator value is greater than the threshold value for the downlink signal strength indicator value; or an uplink repeater gain level when the uplink signal strength indicator value is less than the threshold value for the uplink signal strength indicator value.

Example 39 includes the repeater of Example 1, wherein: the downlink signal strength indicator value is for a selected channel of a selected frequency band, or the uplink signal strength indicator value is for a selected channel of a selected frequency band.

Example 40 includes the repeater of any of Examples 1 or 2, further configured to: identify the downlink signal strength indicator value is greater than the threshold value for the downlink signal strength indicator value; identify the uplink signal strength indicator value is greater than the threshold value for the uplink signal strength indicator value; determine that the downlink signal strength indicator value is caused by channels within the selected band that are not used by the UE; maintain or activate one or more of: the downlink repeater gain level when the downlink signal strength indicator value is greater than the threshold value for the downlink signal strength indicator value; and the uplink repeater gain level when the uplink signal strength indicator value is greater than the threshold value for the uplink signal strength indicator value.

Example 41 includes the repeater of any of Examples 1 or 2, wherein the repeater is further configured to adjust a repeater gain level.

Example 42 includes the repeater of any of Examples 1 or 2, wherein the repeater is further configured to adjust the repeater gain level by one or more of: adjusting a gain of one or more amplifiers in one or more of a downlink amplification path or an uplink amplification path of the repeater; adjusting an attenuation in one or more of the downlink amplification path or the uplink amplification path of the repeater; or enabling, bypassing, or disabling one or more of the downlink amplification path or the uplink amplification path of the repeater.

Example 43 includes the repeater of any of Examples 1 or 2, wherein one or more of the downlink signal strength indicator or the uplink signal strength indicator is one or more of: a received signal strength indicator (RSSI), received at the repeater; a signal to noise ratio (SNR), received at the repeater; a reference signal received power (RSRP), received at the repeater; a reference signal received quality (RSRQ), received at the repeater; a received signal code power (RSCP), received at the repeater; an arbitrary strength unit (ASU), received at the repeater; or a channel quality indicator (CQI), received at the repeater.

Example 44 includes the repeater of any of Examples 1 or 2, wherein the selected band is a long term evolution (LTE) frequency band 2, 4, 5, 12, 13, 17, 25, 26, or 71.

Example 45 includes the repeater of any of Examples 1 or 2, wherein the downlink signal strength indicator value is received at the UE via a wireless connection of the UE with the repeater.

Example 46 includes the repeater of Example 8, wherein the wireless connection includes one or more of: a wireless personal area network (W-PAN) or a wireless local area network (W-LAN).

Example 47 includes the repeater of Example 8, wherein the repeater is further configured to select a threshold value for the downlink signal strength indicator value.

Example 48 includes at least one machine readable storage medium having instructions embodied thereon for adjusting repeater gain based on UE need, the instructions when executed by one or more processors at a repeater perform the following: deactivating a downlink amplification path of the repeater; receiving, from the UE, a deactivated throughput value for data received at the UE in a selected time period; activating the downlink amplification path of the repeater; receiving, from the UE, an activated throughput value for data received at the UE in the selected time period; determining a difference between the deactivated throughput value and the activated throughput value; and reducing or bypassing a repeater gain value on the downlink amplification path when the deactivated throughput value is greater than the activated throughput value by a selected threshold value.

Example 49 includes the at least one machine readable storage medium of Example 11, further comprising instructions that, when executed, perform the following: deactivating the downlink amplification path of the repeater by: reducing a gain of one or more amplifiers in the downlink amplification path; increasing an attenuation in the downlink amplification path; or turning off one or more amplifiers in the downlink amplification path.

Example 50 includes the at least one machine readable storage medium of Example 11, further comprising instructions that, when executed, perform the following: activating the downlink amplification path of the repeater by: increasing a gain of one or more amplifiers in the downlink amplification path; reducing an attenuation in the downlink amplification path; or turning on one or more amplifiers in the downlink amplification path.

Example 51 includes the at least one machine readable storage medium of Example 11, further comprising instructions that, when executed, perform the following: deactivating an uplink amplification path of the repeater by: reducing a gain of one or more amplifiers in the uplink amplification path; increasing an attenuation in the uplink amplification path; or turning off one or more amplifiers in the uplink amplification path.

Example 52 includes the at least one machine readable storage medium of Example 11, further comprising instructions that, when executed, perform the following: activating an uplink amplification path of the repeater by: increasing a gain of one or more amplifiers in the uplink amplification path; reducing an attenuation in the uplink amplification path; or turning on one or more amplifiers in the uplink amplification path.

Various techniques, or certain aspects or portions thereof, can take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. The low energy fixed location node, wireless device, and location server can also include a transceiver module (i.e., transceiver), a counter module (i.e., counter), a processing module (i.e., processor), and/or a clock module (i.e., clock) or timer module (i.e., timer). One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

It should be understood that many of the functional units described in this specification have been labeled as modules, in order to more particularly emphasize their implementation independence. For example, a module can be implemented as a hardware circuit comprising custom very-large-scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices or the like.

In one example, multiple hardware circuits or multiple processors can be used to implement the functional units described in this specification. For example, a first hardware circuit or a first processor can be used to perform processing operations and a second hardware circuit or a second processor (e.g., a transceiver or a baseband processor) can be used to communicate with other entities. The first hardware circuit and the second hardware circuit can be incorporated into a single hardware circuit, or alternatively, the first hardware circuit and the second hardware circuit can be separate hardware circuits.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together, but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network. The modules can be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics can be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A repeater operable to adjust gain based on user equipment need, the repeater configured to:
   measure, at the repeater, an uplink signal strength indicator value of a selected channel of a selected band of a user equipment (UE) received at the repeater;
   identify a threshold value for the uplink signal strength indicator value;
   receive a downlink signal strength indicator value of the selected channel of the selected band of the UE received at the repeater;
   identify a threshold value for the downlink signal strength indicator value;
   identify the downlink signal strength indicator value for the selected channel of the selected band is greater than the threshold value for the downlink signal strength indicator value;
   identify the uplink signal strength indicator value for the selected channel of the selected band is greater than the threshold value for the uplink signal strength indicator value;
   determine that the downlink signal strength indicator value is caused by channels within the selected band that are not used by the UE; and
   maintain or activate one or more of:
      the downlink repeater gain level when the downlink signal strength indicator value is greater than the threshold value for the downlink signal strength indicator value; and
      the uplink repeater gain level when the uplink signal strength indicator value is greater than the threshold value for the uplink signal strength indicator value.

2. The repeater of claim 1, wherein the repeater is further configured to adjust a repeater gain level.

3. The repeater of claim 2, wherein the repeater is further configured to adjust the repeater gain level by one or more of:
   adjusting a gain of one or more amplifiers in one or more of a downlink amplification path or an uplink amplification path of the repeater;
   adjusting an attenuation in one or more of the downlink amplification path or the uplink amplification path of the repeater; or
   enabling, bypassing, or disabling one or more of the downlink amplification path or the uplink amplification path of the repeater.

4. The repeater of claim 1, wherein the downlink signal strength indicator is one or more of:
   a received signal strength indicator (RSSI), received at the repeater;
   a signal to noise ratio (SNR), received at the repeater;
   a reference signal received power (RSRP), received at the repeater;
   a reference signal received quality (RSRQ), received at the repeater;
   a received signal code power (RSCP), received at the repeater;
   an arbitrary strength unit (ASU), received at the repeater; or
   a channel quality indicator (CQI), received at the repeater.

5. The repeater of claim 1, wherein the uplink signal strength indicator is one or more of:
   a received signal strength indicator (RSSI), measured at the repeater;
   a signal to noise ratio (SNR), measured at the repeater;
   a reference signal received power (RSRP), measured at the repeater;
   a reference signal received quality (RSRQ), measured at the repeater;

a received signal code power (RSCP), measured at the repeater;

an arbitrary strength unit (ASU), measured at the repeater; or a channel quality indicator (CQI), measured at the repeater.

6. The repeater of claim 1, wherein the selected band is a long term evolution (LTE) frequency band 2, 4, 5, 12, 13, 17, 25, 26, or 71.

7. The repeater of claim 1, wherein the selected band is one or more of long term evolution (LTE) frequency bands 1-53, 65-76, 85, 87, or 88, or fifth generation (5G) frequency bands n1-3, n5, n7, n8, n12, n14, n18, n20, n25, n28-30, n34, n38-41, n 48, n50, n51, n65, n66, n70, n71, n74-84, n86, n89, n90, n257, n258, n260, n261.

8. A repeater operable to adjust gain based on user equipment need, the repeater configured to:
receive a downlink signal strength indicator value of a selected channel of a selected band of a -user equipment (UE) received at the repeater via a wireless connection of the UE with the repeater;
select a threshold value for the downlink signal strength indicator value; and
identify the downlink signal strength indicator value for the selected channel of the selected band is greater than the threshold value for the downlink signal strength indicator value;
determine that the downlink signal strength indicator value is caused by channels within the selected band that are not used by the UE; and
maintain or activate the downlink repeater gain level when the downlink signal strength indicator value is greater than the threshold value for the downlink signal strength indicator value.

9. The repeater of claim 8, wherein the wireless connection includes one or more of a wireless personal area network (W-PAN) or a wireless local area network (W-LAN).

10. The repeater of claim 8, wherein the repeater is further configured to adjust a repeater gain level.

11. The repeater of claim 10, wherein the repeater is further configured to adjust the repeater gain level by one or more of:
adjusting a gain of one or more amplifiers in one or more of a downlink amplification path or an uplink amplification path of the repeater;
adjusting an attenuation in one or more of the downlink amplification path or the uplink amplification path of the repeater; or
enabling, bypassing, or disabling one or more of the downlink amplification path or the uplink amplification path of the repeater.

12. The repeater of claim 8, wherein the downlink signal strength indicator is one or more of:
a received signal strength indicator (RSSI), measured at the UE;
a signal to noise ratio (SNR), measured at the UE;
a reference signal received power (RSRP), measured at the UE;
a reference signal received quality (RSRQ), measured at the UE;
a received signal code power (RSCP), measured at the UE;
an arbitrary strength unit (ASU), measured at the UE; or
a channel quality indicator (CQI), measured at the UE.

13. A repeater operable to adjust gain based on user equipment need, the repeater configured to:
receive a downlink signal strength indicator value of a selected channel of a selected band -of a user equipment (UE) received at the repeater;
identify a threshold value for the downlink signal strength indicator value;
measure, at the repeater, an uplink signal strength indicator value of a selected channel of a selected band of the UE received at the repeater;
identify a threshold value for the uplink signal strength indicator value; and
identify the downlink signal strength indicator value for the selected band is greater than the threshold value for the downlink signal strength indicator value;
identify the uplink signal strength indicator value for the selected band is greater than the threshold value for the uplink signal strength indicator value;
determine that the downlink signal strength indicator value is caused by channels within the selected band that are not used by the UE; and
maintain or activate one or more of:
the downlink repeater gain level when the downlink signal strength indicator value is greater than the threshold value for the downlink signal strength indicator value; and
the uplink repeater gain level when the uplink signal strength indicator value is greater than the threshold value for the uplink signal strength indicator value.

* * * * *